(12) United States Patent
Kida

(10) Patent No.: US 10,703,119 B2
(45) Date of Patent: Jul. 7, 2020

(54) FLEXIBLE MEMBER, WIRING MEMBER, LIQUID DISCHARGE HEAD, LIQUID DISCHARGE DEVICE, LIQUID DISCHARGE APPARATUS, ELECTRONIC DEVICE

(71) Applicant: Hitoshi Kida, Kanagawa (JP)

(72) Inventor: Hitoshi Kida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 22 days.

(21) Appl. No.: 16/125,287

(22) Filed: Sep. 7, 2018

(65) Prior Publication Data

US 2019/0070873 A1 Mar. 7, 2019

(30) Foreign Application Priority Data

Sep. 7, 2017 (JP) .................. 2017-171762

(51) Int. Cl.
*B41J 25/00* (2006.01)
*B41J 2/14* (2006.01)
*H01B 7/04* (2006.01)
*H01B 7/08* (2006.01)
*H05K 1/11* (2006.01)

(52) U.S. Cl.
CPC .............. *B41J 25/001* (2013.01); *B41J 2/14* (2013.01); *H01B 7/04* (2013.01); *H01B 7/0846* (2013.01); *H05K 1/118* (2013.01); *B41J 2002/14491* (2013.01); *H05K 2201/2009* (2013.01)

(58) Field of Classification Search
CPC ........ B41J 25/001; B41J 2/14; B41J 2/14072; B41J 2/17526; B41J 2/1753; B41J 2/04541; B41J 2002/14491; H01B 7/04; H01B 7/0846; H05K 1/118
See application file for complete search history.

(56) References Cited

U.S. PATENT DOCUMENTS

| | | | | |
|---|---|---|---|---|
| 2009/0309929 | A1* | 12/2009 | Kanda et al. | .............. B41J 2/14 |
| 2011/0242223 | A1* | 10/2011 | Koseki | ................ B41J 2/14209 |
| 2012/0069095 | A1 | 3/2012 | Kida et al. | |
| 2012/0212547 | A1 | 8/2012 | Takemoto et al. | |
| 2012/0229542 | A1 | 9/2012 | Kida | |

(Continued)

FOREIGN PATENT DOCUMENTS

| | | |
|---|---|---|
| JP | 2001-318618 | 11/2001 |
| JP | 2001-332820 | 11/2001 |

(Continued)

*Primary Examiner* — Juanita D Jackson
(74) *Attorney, Agent, or Firm* — Oblon, McClelland, Maier & Neustadt, L.L.P.

(57) ABSTRACT

A flexible member includes a first member, a second member overlapping the first member, and a plurality of second reinforcing portions. The first member includes a non-overlapping region not overlapping the second member. The non-overlapping region includes an edge portion of the first member. The second member includes a plurality of first reinforcing portions between which the non-overlapping region is interposed. Each of the plurality of second reinforcing portions overlaps both a first area of the second member in which one of the plurality of first reinforcing portions is formed and a second area of the second member other than the first area when the flexible member is projected from a direction perpendicular to a surface of the flexible member.

20 Claims, 21 Drawing Sheets

(56) References Cited

U.S. PATENT DOCUMENTS

| | | | |
|---|---|---|---|
| 2014/0022305 A1 | 1/2014 | Kida | |
| 2015/0029270 A1* | 1/2015 | Takemoto et al. | |
| 2015/0130873 A1* | 5/2015 | Kodoi et al. | ......... B41J 2/14072 |
| 2015/0210077 A1* | 7/2015 | Tomizawa et al. | ......................... |
| | | | B41J 2/14201 |
| 2016/0031212 A1 | 2/2016 | Kida | |
| 2016/0152025 A1 | 6/2016 | Kida | |
| 2018/0141336 A1 | 5/2018 | Kida et al. | |
| 2018/0146551 A1 | 5/2018 | Kida | |

FOREIGN PATENT DOCUMENTS

| | | |
|---|---|---|
| JP | 2003-273476 | 9/2003 |
| JP | 2010-214791 | 9/2010 |
| JP | 2011-077208 | 4/2011 |
| JP | 2011-249383 | 12/2011 |
| JP | 2013-059984 | 4/2013 |
| JP | 2016-134453 | 7/2016 |

* cited by examiner

US 10,703,119 B2

FLEXIBLE MEMBER, WIRING MEMBER, LIQUID DISCHARGE HEAD, LIQUID DISCHARGE DEVICE, LIQUID DISCHARGE APPARATUS, ELECTRONIC DEVICE

CROSS-REFERENCE TO RELATED APPLICATION

This patent application is based on and claims priority pursuant to 35 U.S.C. § 119(a) to Japanese Patent Application No. 2017-171762, filed on Sep. 7, 2017 in the Japan Patent Office, the entire disclosure of which is hereby incorporated by reference herein.

BACKGROUND

Technical Field

Aspects of the present disclosure relate to a flexible member, a wiring member, a liquid discharge head, a liquid discharge device, a liquid discharge apparatus, and an electronic device.

Related Art

As a flexible member, for example, a flexible wiring member is known that includes a base member, a plurality of electrode patterns (conductor wires) arranged side by side on the base member, and a cover member covering the plurality of conductor wires and exposing terminal portions of the conductor wires. The base member has wide portions on both sides of the plurality of conductor wires, and a part of the cover member is extended to the wide portions.

SUMMARY

In an aspect of the present disclosure, there is provided a flexible member that includes a first member, a second member overlapping the first member, and a plurality of second reinforcing portions. The first member includes a non-overlapping region not overlapping the second member. The non-overlapping region includes an edge portion of the first member. The second member includes a plurality of first reinforcing portions between which the non-overlapping region is interposed. Each of the plurality of reinforcing portions overlaps both a first area of the second member in which one of the plurality of first reinforcing portions is formed and a second area of the second member other than the first area when the flexible member is projected from a direction perpendicular to a surface of the flexible member.

In another aspect of the present disclosure, there is provided a flexible member that includes a first member and a second member overlapping the first member. When the flexible member is projected from a direction perpendicular to a surface of the flexible member, the first member includes a non-overlapping region not overlapping the second member, the non-overlapping region includes an edge portion of the first member, the second member includes a plurality of first reinforcing portions between which the non-overlapping region is interposed and a plurality of second reinforcing portions, each of which overlaps the second member and one of the plurality of first reinforcing portions.

In still another aspect of the present disclosure, there is provided a wiring member that includes the flexible member according to any one of the above-described aspects and a connecting member. The connecting member includes a plurality of conductor wires connected to the plurality of conductor wires of the flexible member.

In still yet another aspect of the present disclosure, there is provided a liquid discharge head that includes the flexible member according to any one of the above-described aspects.

In still yet another aspect of the present disclosure, there is provided a liquid discharge device that includes the liquid discharge head.

In still yet another aspect of the present disclosure, there is provided a liquid discharge apparatus that includes the flexible member according to any one of the above-described aspects.

In still yet another aspect of the present disclosure, there is provided an electronic device that includes the flexible member according to any one of the above-described aspects.

BRIEF DESCRIPTION OF THE SEVERAL VIEWS OF THE DRAWINGS

A more complete appreciation of the disclosure and many of the attendant advantages and features thereof can be readily obtained and understood from the following detailed description with reference to the accompanying drawings, wherein.

Figure 1:
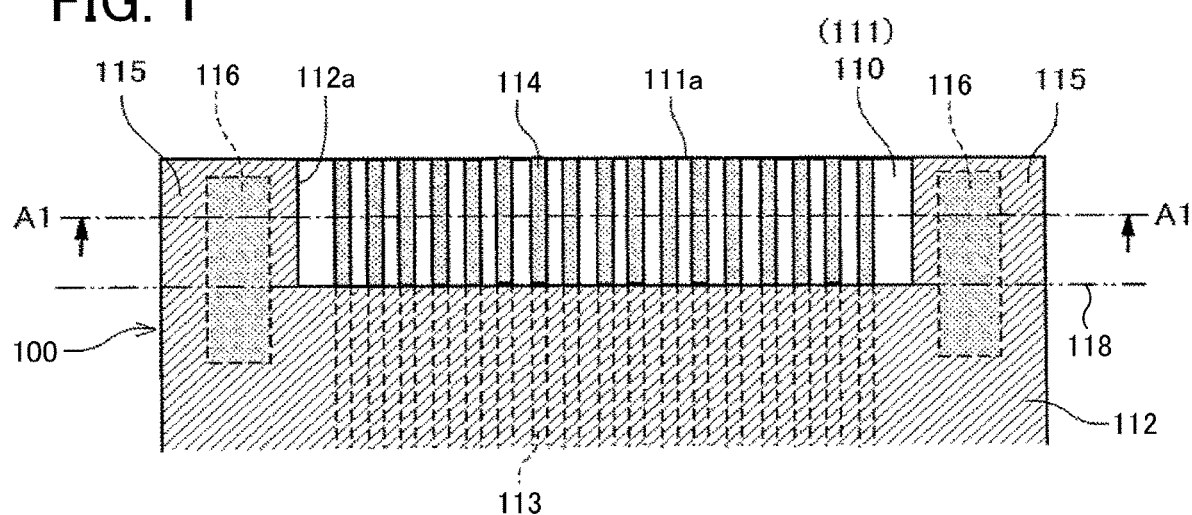
FIG. 1 is a partial plan view of a flexible member according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Hereinafter, embodiments of the present disclosure are described with reference to the drawings. In the drawings, the same or corresponding parts are denoted by the same reference numerals, and redundant description thereof are simplified or omitted as appropriate.

Figure 2:
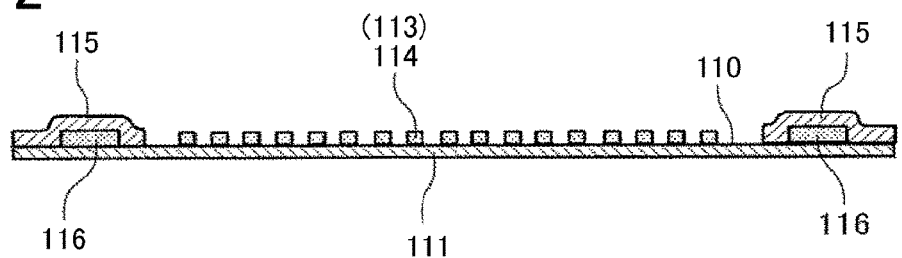
FIG. 2 is a cross-sectional view of the flexible member cut along line A1-A1 of FIG. 1.

Below, embodiments of the present disclosure are described with reference to the accompanying drawings. A first embodiment of the present disclosure is described with reference to FIGS. 1 and 2. FIG. 1 is a plan view of a part of a flexible member according to the first embodiment. FIG. 2 is a cross-sectional view of the flexible member, cut along line A1-A1 of FIG. 1. Note that the cross-sectional view of FIG. 2 is illustrated by an end face.

A flexible member 100 according to the first embodiment is a flexible wiring member and includes a first member 111 as a flexible base (base member) and a second member 112 as a cover member overlapping with the first member 111.

A plurality of conductor wires 113 are arranged side by side in the first member 111. The second member 112 covers the plurality of conductor wires 113. Recesses 112a expose terminal portions (terminal electrodes) 114 of the plurality of conductor wires 113.

In the first embodiment, the first member 111 includes an insulating resin film made of, for example, polyimide. The conductor wire 113 is formed of a highly conductive metal, such as copper (Cu) or a copper alloy. The terminal portion 114 on a distal end side of the conductor wire 113 is a terminal electrode, and includes a surface layer of, for example, gold.

The second member 112 is made of an insulating resin, such as polyimide, PET, PVC, epoxy resin, acrylic resin, or photopolymer resin, and is formed by bonding a resin film or applying and curing a liquid resin.

As the difference in the coefficient of thermal expansion between the first member 111 and the second member 112 is smaller, the flexible member 100 is less likely to warp. Therefore, the first member 111 and the second member 112 are preferably made of the same material.

Here, in the second member 112, a region in which the recesses 112a exposing the terminal portions 114 of the conductor wires 113 are disposed is a region (hereinafter referred to as "non-overlapping region") 110 in which the second member 112 does not overlap with the first member 111.

The non-overlapping region 110 includes an edge portion 111a of the first member 111. That is, the second member 112 is not overlapped on the edge portion 111a of the first member 111, and the non-overlapping region 110 reaches the edge portion 111a of the first member 111.

The second member 112 forms two first reinforcing portions 115 sandwiching the non-overlapping region 110. Since the first reinforcing portions 115 are formed of the second member 112, the first reinforcing portions 115 are disposed on one surface on which the conductor wires 113 of the first member 111 are disposed. The first reinforcing portions 115 extend to the distal end (or a portion near the distal end) of the first member 111.

In the present embodiment, the first reinforcing portions 115 are disposed at both end portions of the first member 111 across the plurality of terminal portions (terminal electrodes) 114 in a direction (hereinafter, terminal-portion arrangement direction) in which the terminal portions 114 of the plurality of conductor wires 113 are arranged side by side.

The flexible member 100 includes second reinforcing portions 116, each that overlaps both a first area of the second member 112 in which the first reinforcing portion 115 is formed and a second area other than the first area of the second member 112 when the flexible member 100 is projected from a direction perpendicular to a surface of the flexible member 100.

The second reinforcing portion 116 is disposed on a side of the first member 111 on which the second member 112 is disposed.

In the present embodiment, the second reinforcing portion 116 is disposed across a line (extension line) 118 extending a bottom of the recesses 112a of the second member 112 (a distal edge except the first reinforcing portions 115), in a direction in which the terminal portion 114 of the conductor wire 113 extends (a direction along the terminal portion 114).

The second reinforcing portion 116 is a conductive pattern obtained by patterning a conductive material, such as a copper foil. In the present embodiment, the width of the second reinforcing portion 116 in the terminal-portion arrangement direction, in which the terminal portions 114 of the conductor wires 113 are arranged side by side, is greater than the width of the terminal portion 114 of the conductor wire 113. Such a configuration can achieve a reinforcing effect greater than in a case in which the width of the second reinforcing portion 116 is equal to the width of the conductor wire 113.

The extension line 118 is a boundary line between the first reinforcing portion 115, which is hard to bend, and a region in which the second member 112 is formed and is harder to bend than the first reinforcing portion 115.

In such a case, in the thickness direction of the first member 111, the second reinforcing portion 116 is interposed between the first member 111 and the first reinforcing portion 115. More specifically, when the conductor wires 113 are formed by patterning on the first member 111, the second reinforcing portions 116 are also formed in the second member 112 and the first reinforcing portions 115 covering the second reinforcing portions 116 are integrally formed with the second member 112.

The second reinforcing portions are also formed in the second member 112 when the conductor wires 113 are formed by patterning in the first member 111. Accordingly, in the present embodiment, the second reinforcing portions 116 are formed with the same conductor pattern as the conductor wires 113. Thus, the conductor wires 113 and the second reinforcing portions 116 can be formed by the same patterning process.

Figure 3:
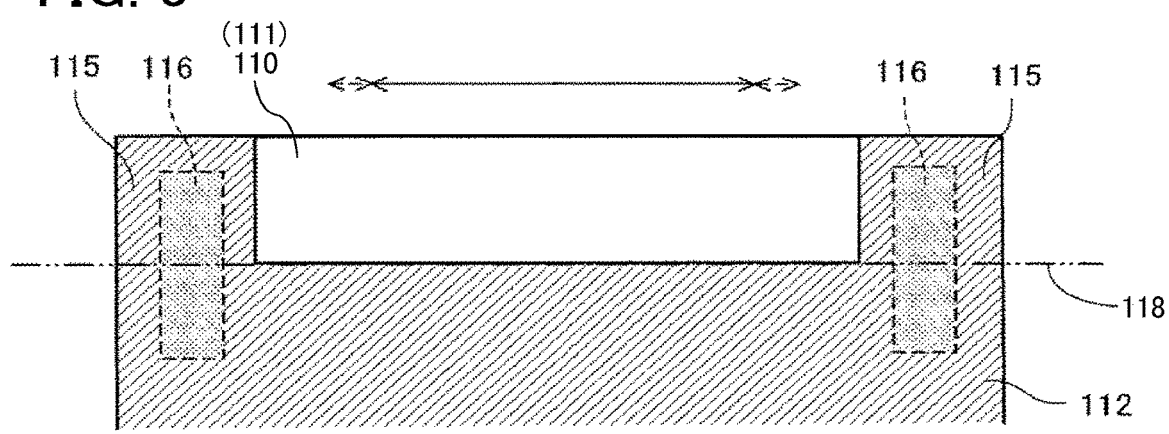
FIG. 3 is a partial plan view for explaining an operational effect of the flexible member according to the first embodiment.
Figure 4A:
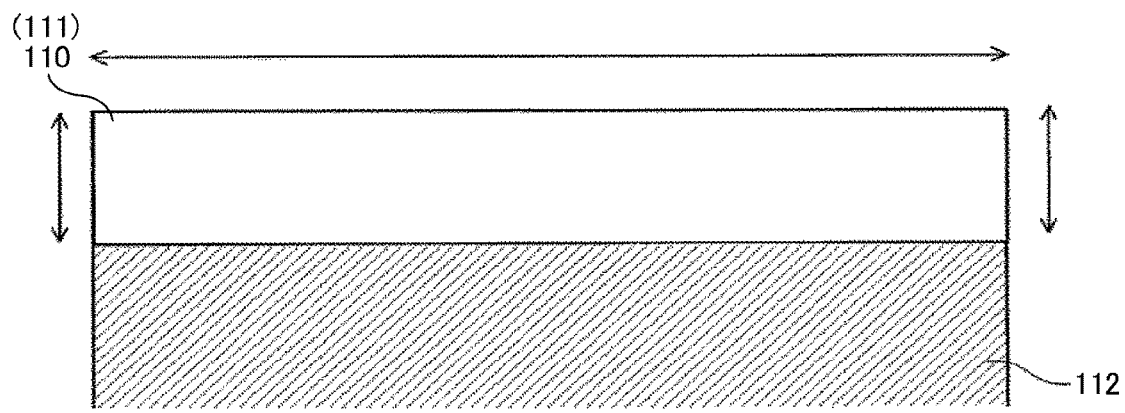
FIGS. 4A, 4B, and 4C are plan views of Comparative Examples 1, 2, and 3, respectively.
Figure 4B:
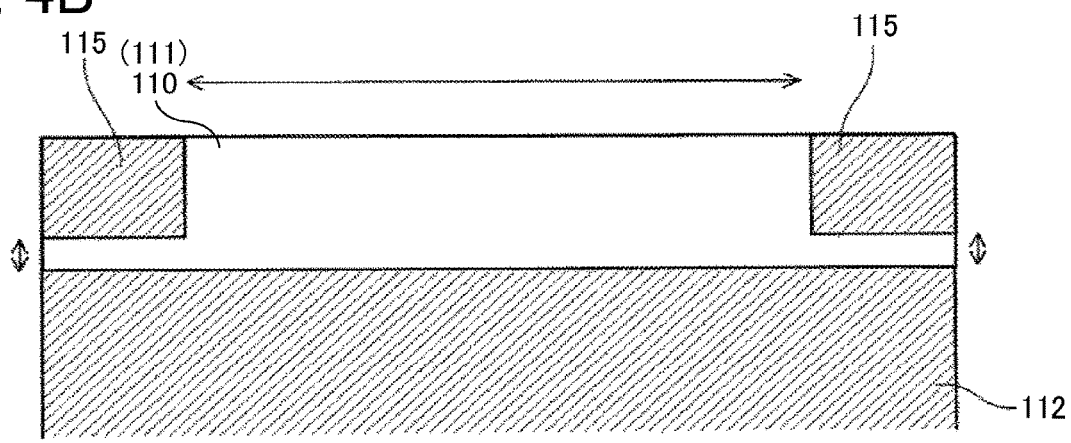
Figure 4C:
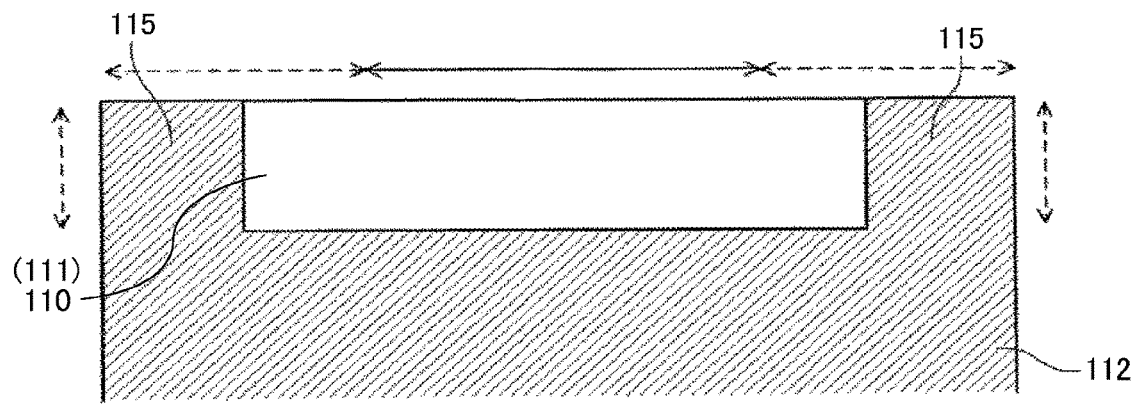
Figure 5A:
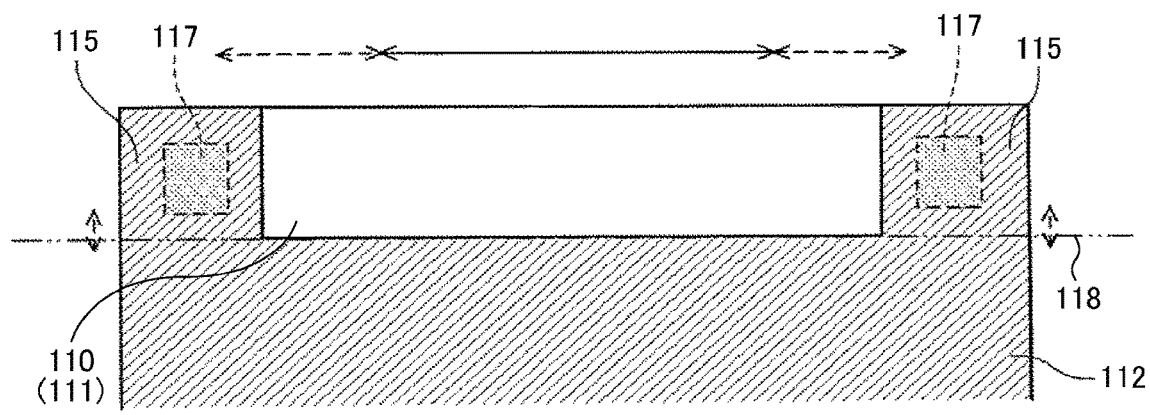
FIGS. 5A and 5B are plan views of Comparative Examples 4 and 5, respectively.
Figure 5B:
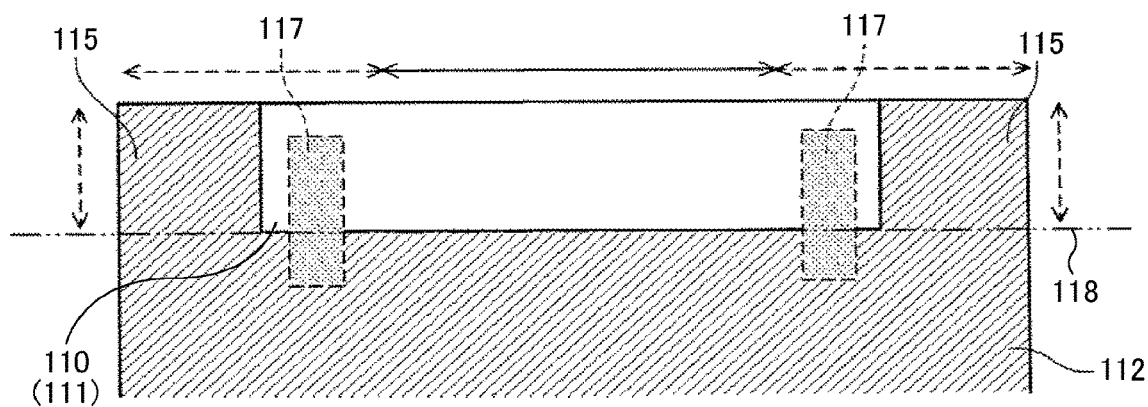

The operation and effect of the flexible member thus configured are described with reference also to FIGS. 3 to 5B. FIG. 3 is a plan view of the first embodiment. FIGS. 4A, 4B, and 4C are plan views of Comparative Examples 1, 2, and 3, respectively. FIGS. 5A and 5B are plan views illustrating comparative examples 4 and 5, respectively. Note that the conductor wires are not illustrated here. In FIGS. 3 to 5B, solid-line arrows indicate easy-to-bend portions (ranges) and broken-line arrows indicate portions (ranges) that are slightly more bendable than the easy-to-bend portions.

In Comparative Example 1 illustrated in FIG. 4A, the second member 112 is not disposed on the entire distal end portion of the first member 111, and the second member 112 does not include the first reinforcing portions 115 of the first embodiment.

In the configuration of Comparative Example 1, the entire distal end portion of the flexible member 100 is composed of the non-overlapping region 110 of the first member 111 and is therefore easy to bend.

In Comparative Example 2 illustrated in FIG. 4B, the first reinforcing portions 115 spaced apart from the second member 112 are disposed at both ends in the terminal-portion arrangement direction of the distal end portion of the first member 111.

In the configuration of Comparative Example 2, since the first reinforcing portions 115 are spaced apart from the second member 112, the range in which the flexible member 100 is easy to bend in the terminal-portion arrangement direction decreases. However, the flexible member 100 remains easy to bend in a region between the second member 112 and the first reinforcing portions 115.

In Comparative Example 3 illustrated in FIG. 4C, the first reinforcing portions 115 formed of the second member 112 are disposed at both end portions in the terminal-portion arrangement direction of the distal end portion of the first member 111.

In the configuration of Comparative Example 3, the first reinforcing portions 115 support portions of the first member 111 corresponding to the recesses 112a of the second member 112 from both sides in the terminal-portion arrangement direction. The distal end portion of the flexible member 100 is less easy to bend in Comparative Example 3 than in Comparative Examples 1 and 2.

However, even in the configuration of Comparative Example 3, the distal end portion of the flexible member 100 is only reinforced with the thickness of the second member 112. Accordingly, it is not sufficient for reinforcement, and it is only improved to such a degree that the distal end portion of the flexible member 100 is somewhat easy to bend.

In Comparative Example 4 illustrated in FIG. 5A, second reinforcing portions 117 (to which a different reference numeral is allocated to distinguish from the second reinforcing portions 116 according to the above-described embodiment) are disposed only within the first reinforcing portions 115 when the first member 111 is projected from a direction perpendicular to a surface of the first member 111.

In the configuration of Comparative Example 4, the first reinforcing portion 115 can be hardened, and the distal end portion of the flexible member 100 is harder to bend than in Comparative Example 3.

However, the configuration of Comparative Example 4 is not sufficient for bending at a portion of the extension line 118 of the bottom of the recesses 112a in the extending direction of the conductor wire 113.

In Comparative Example 5 illustrated in FIG. 5B, the second reinforcing portions 117 overlap the non-overlapping region 110 of the first member 111 and the second member 112.

However, in the configuration of Comparative Example 5, the first reinforcing portions 115 do not overlap the second reinforcing portions 117. Accordingly, the rigidity of the first reinforcing portions 115 is not increased, and the warp of the entire flexible member 100 is not sufficiently reduced.

Therefore, in the present embodiment illustrated in FIG. 3, the second reinforcing portions 116 overlap both the first reinforcing portions 115 and the second member 112 when the first member 111 is projected from the direction perpendicular to the surface of the first member 111.

Such a configuration can harden the first reinforcing portions 115 with the second reinforcing portions 116 and also become strong against bending at the portion of the extension line 118 on the bottom of the recesses 112a in the extending direction of the terminal portion 114 of the conductor wire 113, thus suppressing the warp of the flexible member as a whole.

Figure 6:
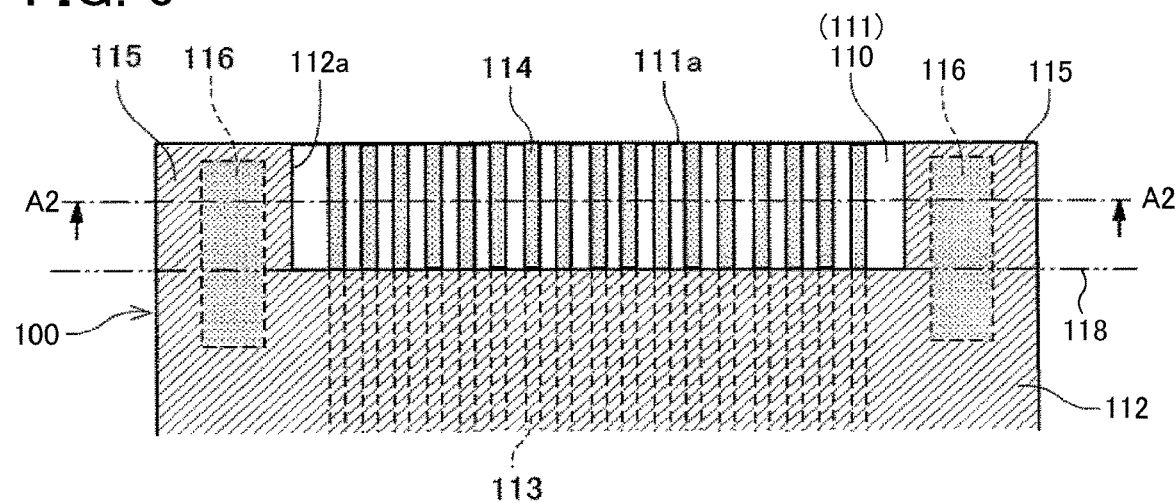
FIG. 6 is a partial plan view of the flexible member according to a second embodiment of the present disclosure.
Figure 7:
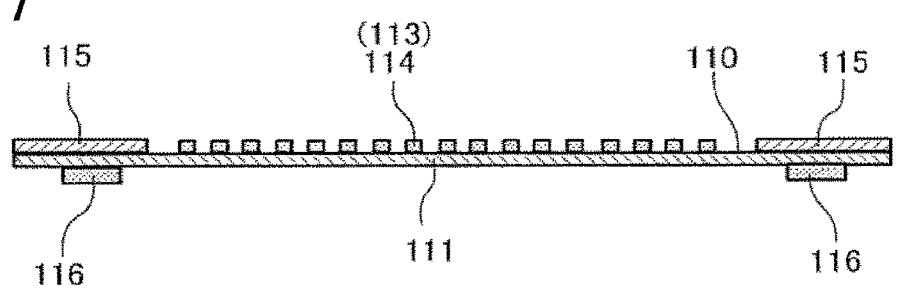
FIG. 7 is a cross-sectional view of the flexible member cut along line A2-A2 of FIG. 6.

Next, a second embodiment of the present disclosure is described with reference to FIGS. 6 and 7. FIG. 6 is a partial plan view of the flexible member according to the second embodiment. FIG. 7 is a cross-sectional view of the flexible member, cut along line A2-A2 in FIG. 6.

Similarly to the first embodiment, the second member 112 of the flexible member 100 forms the first reinforcing portions 115 between which the non-overlapping region 110 is interposed. In such a case, the first reinforcing portions 115 are disposed on both sides in the terminal-portion arrangement direction of one surface on which the conductor wires 113 of the first member 111 are disposed.

The second reinforcing portions 116 are disposed on the other surface of the first member 111 opposite to the surface (one surface) on which the conductor wires 113 are disposed.

For example, in the case of using a double-sided flexible printed circuit (FPC) with copper foils attached to both surfaces of the first member 111, the second reinforcing portions 116 can be formed by leaving a part of a copper foil pattern on the back surface (the other surface) by etching. Alternatively, the second reinforcing portions 116 can be formed by affixing a hard member (such as a metal plate, a resin plate, or a polyimide film, a PET film, or a polyimide varnish similarly to the first reinforcing portions 115) to the back surface.

When the flexible member 100 is projected from the direction perpendicular to the surface of the flexible member 100, each of the second reinforcing portions 116 overlaps both the first area of the second member 112 in which the first reinforcing portion 115 is formed and the second area other than the first area of the second member 112, and crosses the extension line 118 in the extending direction of the terminal portion 114 of the conductor wire 113.

Similarly with the above-described first embodiment, such a configuration can harden the first reinforcing portions 115 themselves with the second reinforcing portions 116 and also become strong against bending at the portion of the extension line 118 of the bottom of the recesses 112a in the extending direction of the conductor wire 113, thus suppressing the warp of the flexible member 100 as a whole.

In addition, in the present embodiment, the second reinforcing portions 116 are not disposed on the front surface (one surface) of the first member 111 but on the back surface (the other surface) of the first member 111. Unlikely with a configuration in which the second reinforcing portions 116 are disposed on the front surface (one surface), such a configuration can prevent a convex portion beyond the thickness of the second member 112 from being formed on the surface of the first reinforcing portion 115.

Accordingly, when the flexible member 100 is overlaid on another flexible member for joint, the second reinforcing portions 116 do not interfere with the mutual contact of (the terminal portions of) the conductor wires.

Figure 8:
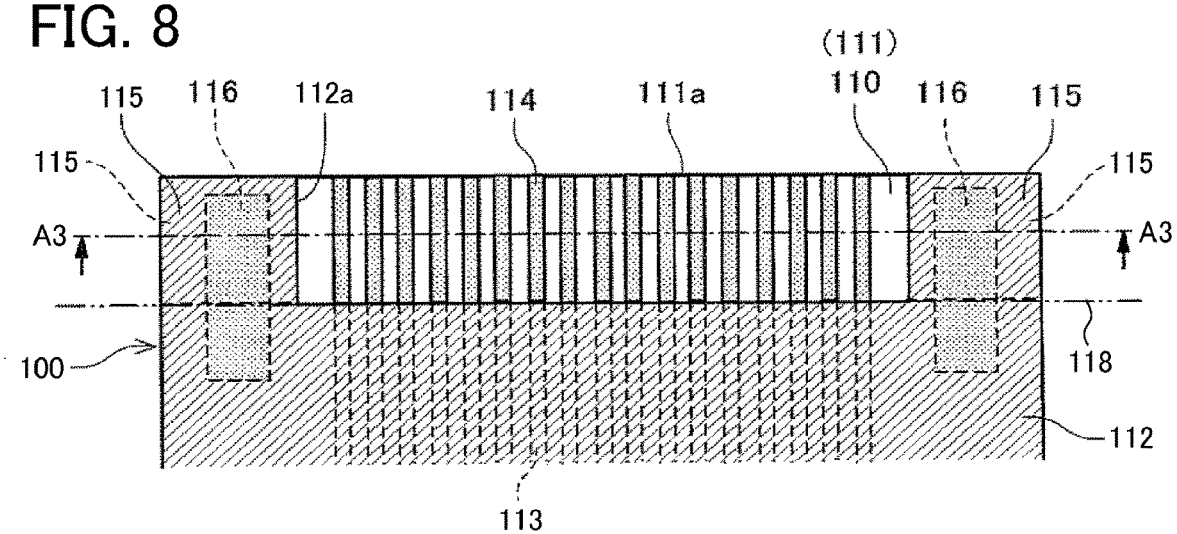
FIG. 8 is a partial plan view of the flexible member according to a third embodiment of the present disclosure.
Figure 9:
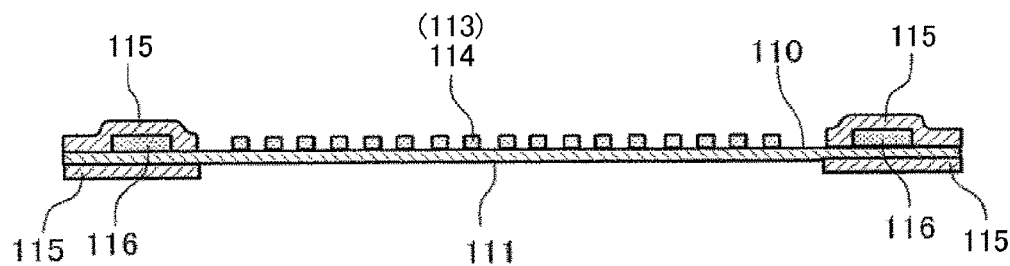
FIG. 9 is a cross-sectional view of the flexible member cut along line A3-A3 of FIG. 8.

Next, a third embodiment of the present disclosure is described with reference to FIGS. 8 and 9. FIG. 8 is a partial plan view of the flexible member according to the third embodiment. FIG. 9 is a cross-sectional view of the flexible member, cut along line A3-A3 of FIG. 8.

Similarly to the first embodiment, the flexible member 100 according to the third embodiment includes the first reinforcing portions 115 formed of the second member 112, on one surface on which the conductor wires 113 (terminal portions 114) of the first member 111 are arranged. The non-overlapping region 110 is interposed between the first reinforcing portions 115.

Similarly with the first embodiment, the flexible member 100 according to the third embodiment includes the second reinforcing portions 116 on one surface on which the conductor wires 113 of the first member 111 are disposed. Each of the second reinforcing portions 116 overlaps both a first area of the second member 112 in which the first reinforcing portion 115 is formed and a second area of the second member 112 other than the first area when the flexible member 100 is projected from the direction perpendicular to the surface of the flexible member 100.

In the present embodiment, the first reinforcing portions 115 are also disposed on the other surface of the first member 111 on which the conductor wires 113 are not disposed.

In such a case, the first reinforcing portions 115 on the other surface can be formed of a polyimide film, a PET film, or a polyimide varnish. The same material as the material of the second member 112 can be preferably used. Using the same manufacturing method, material, and the like can reduce the cost. For example, a metal plate or a resin plate attached only for reinforcement can be used as the first reinforcing portions 115.

The first reinforcing portions 115 disposed on both surfaces of the first member 111 in this manner can more harden both end portions in the terminal-portion arrangement direction, thus more suppressing the warp of the flexible member 100 than in the first embodiment.

Figure 10:
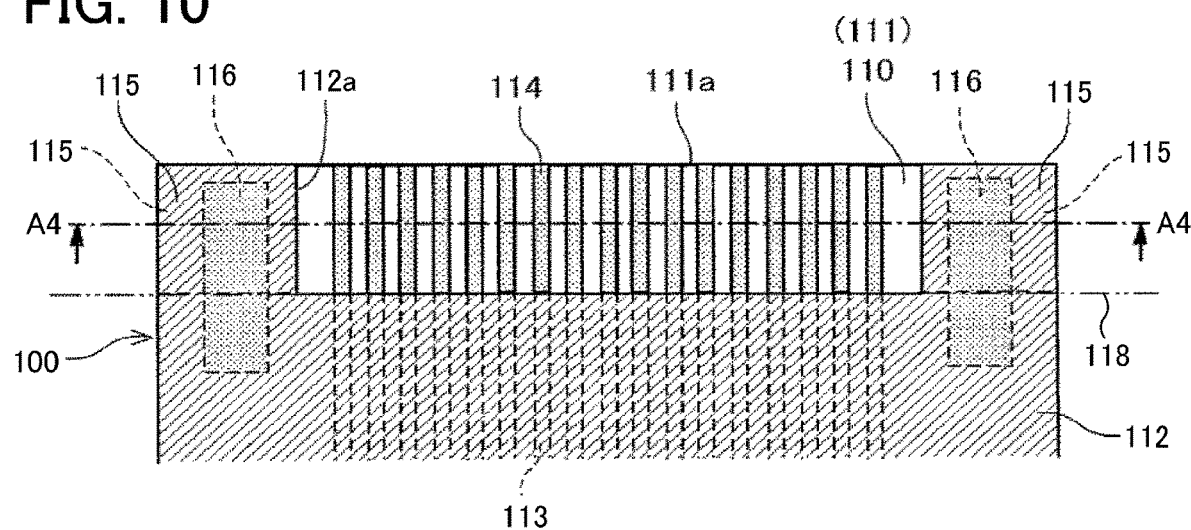
FIG. 10 is a partial plan view of the flexible member according to a fourth embodiment of the present disclosure.
Figure 11:
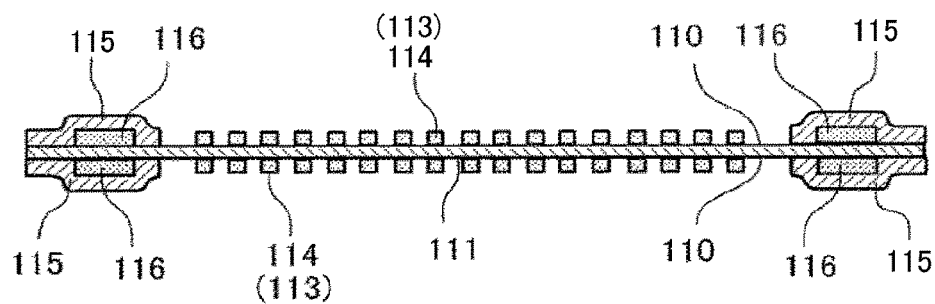
FIG. 11 is a cross-sectional view of the flexible member cut along line A4-A4 of FIG. 10.

Next, a fourth embodiment of the present disclosure is described with reference to FIGS. 10 and 11. FIG. 10 is a partial plan view of the flexible member according to the fourth embodiment. FIG. 11 is a cross-sectional view of the flexible member, cut along line A4-A4 of FIG. 10.

The flexible member 100 according to the fourth embodiment includes the plurality of conductor wires 113 arranged on both surfaces of the first member 111 and the plurality of second members 112 that covers the plurality of conductor wires 113 and exposes the terminal portions 114 by the recesses 112a. Thus, non-overlapping regions 110 are disposed on both surfaces of the first member 111.

Similarly with the first embodiment, the plurality of second members 112 on both surfaces of the first member 111 form the first reinforcing portions 115 between which the non-overlapping region 110 is interposed. The flexible member 100 includes the second reinforcing portions 116, each that overlaps both the first area of the second member 112 in which the first reinforcing portion 115 is formed and the second area other than the first area of the second member 112 when the flexible member 100 is projected from the direction perpendicular to the surface of the flexible member 100. The second reinforcing portions 116 cross the extension line 118 in the extending direction of the terminal portion 114 of the conductor wire 113.

In such a configuration, the conductor wires 113, the second members 112, the first reinforcing portions 115, and the second reinforcing portions 116 are disposed on both surfaces, thus more suppressing warp of the flexible member 100.

Figure 12:
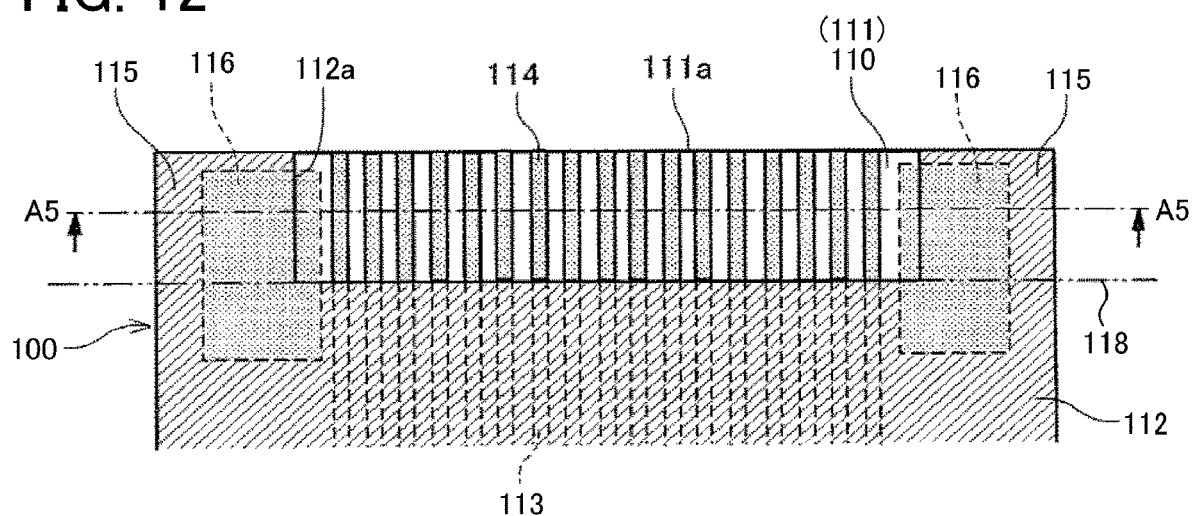
FIG. 12 is a partial plan view of the flexible member according to a fifth embodiment of the present disclosure.
Figure 13:
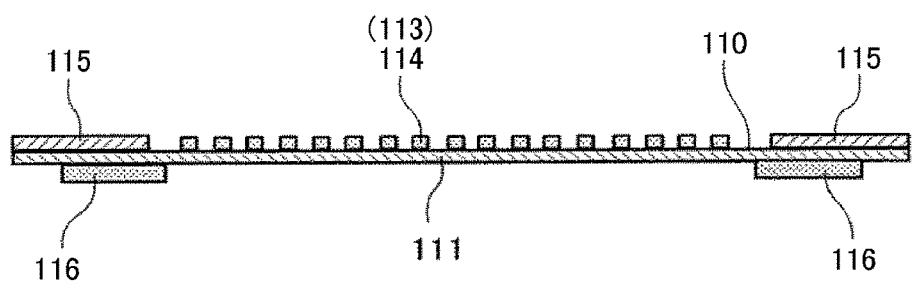
FIG. 13 is a cross-sectional view of the flexible member cut along line A5-A5 of FIG. 12.

Next, a fifth embodiment of the present disclosure is described with reference to FIGS. 12 and 13. FIG. 12 is a partial plan view of the flexible member according to the fifth embodiment. FIG. 13 is a cross-sectional view of the flexible member, cut along line A5-A5 of FIG. 12.

Similarly with the second embodiment, the flexible member 100 according to the fifth embodiment includes the first reinforcing portions 115 formed of the second member 112 on one surface of the first member 111 and the second reinforcing portions 116 on the other surface of the first member 111.

When the flexible member 100 is projected from the direction perpendicular to the surface of the flexible member 100, each of the second reinforcing portions 116 is disposed in an area in which each second reinforcing portion 116 overlaps each first reinforcing portion 115 and the second member 112 and a part of the second reinforcing portion 116 overlaps an area in which the conductor wires 113 of the first member 111 are arranged.

Widening the second reinforcing portion 116 as described above can further suppress warp of the flexible member 100.

Figure 14:
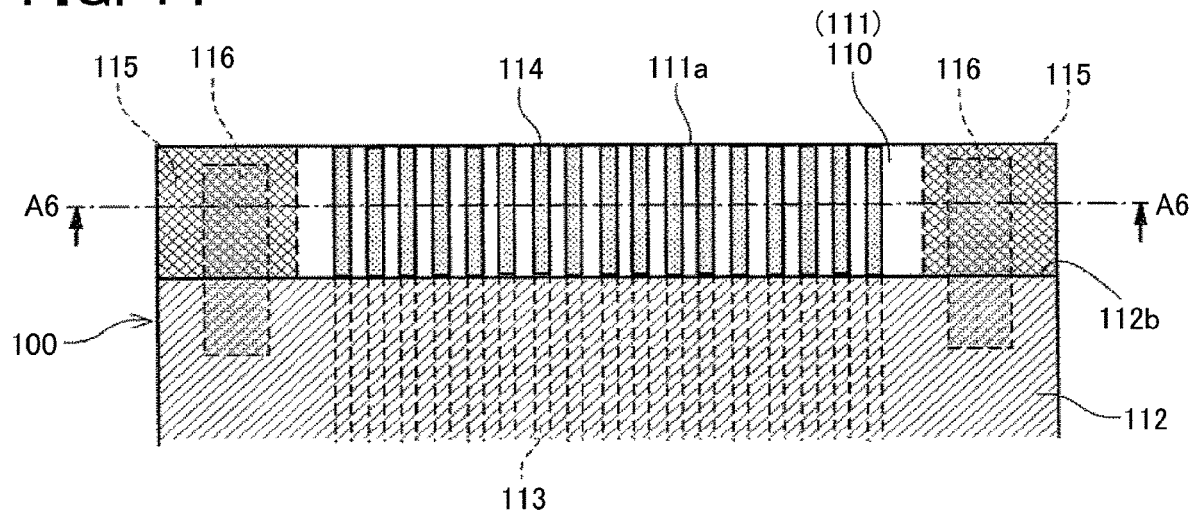
FIG. 14 is a partial plan view of the flexible member according to a sixth embodiment of the present disclosure.
Figure 15:
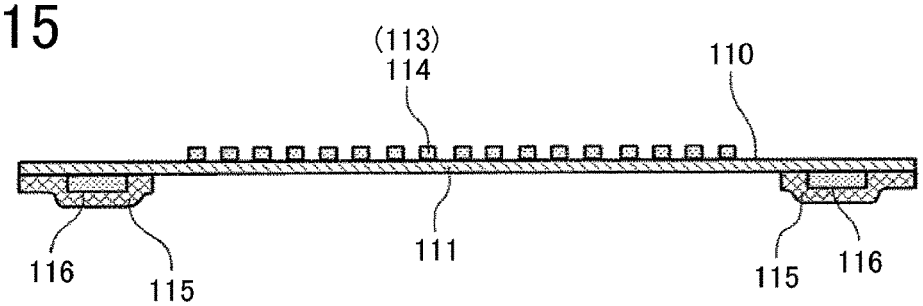
FIG. 15 is a cross-sectional view of the flexible member cut along line A6-A6 of FIG. 14.

Next, a sixth embodiment of the present disclosure is described with reference to FIGS. 14 and 15. FIG. 14 is a partial plan view of the flexible member according to the sixth embodiment. FIG. 15 is a cross-sectional view of the flexible member, cut along line A6-A6 of FIG. 14.

In the flexible member 100 according to the sixth embodiment, the first reinforcing portions 115 of the second member 112 are not provided on one surface of the first member 111 on which the plurality of conductor wires 113 is disposed. The second member 112 has a distal end 112b corresponding to the position of the extension line 118 of the first embodiment.

Thus, the flexible member 100 includes a non-overlapping region 110 in which the second member 112 does not overlap the first member 111 when the flexible member 100 is projected from the direction perpendicular to the surface of the flexible member 100. The non-overlapping region 110 includes the edge portion 111a of the first member 111.

On the other surface of the first member 111, two first reinforcing portions 115 are disposed with a part of the non-overlapping region 110 interposed between the first reinforcing portions 115, and each of the second reinforcing portions 116 is disposed to overlap both of the first member 111 and the second member 112, when the flexible member 100 is projected from the direction perpendicular to the surface of the flexible member 100.

Here, as the first reinforcing portion 115, for example, a polyimide film, a PET film, a polyimide varnish, a metal plate, or a resin plate can be used. The second reinforcing portion 116 is preferably made of a copper foil. In other words, as described above, the second reinforcing portions 116 can be formed by leaving a copper foil pattern on the back surface by etching. Thus, the number of man-hours and materials can be reduced, thus allowing cost reduction. Note that, for example, a polyimide film, a PET film, a polyimide varnish, a metal plate, or a resin plate can also be used for the second reinforcing portion 116.

By providing the first reinforcing portions 115 separately from the second member 112 as described above, a material having a higher rigidity than the second member 112 can be used as the first reinforcing portion 115, thus allowing enhancement of a reinforcing effect.

Even in a case in which the first reinforcing portions 115 are disposed on the surface opposite to the second member 112, the second reinforcing portion 116 overlapping the first reinforcing portion 115 and the second member 112 can enhance the reinforcing effect, thus suppressing the warp of the flexible member 100.

Figure 16:
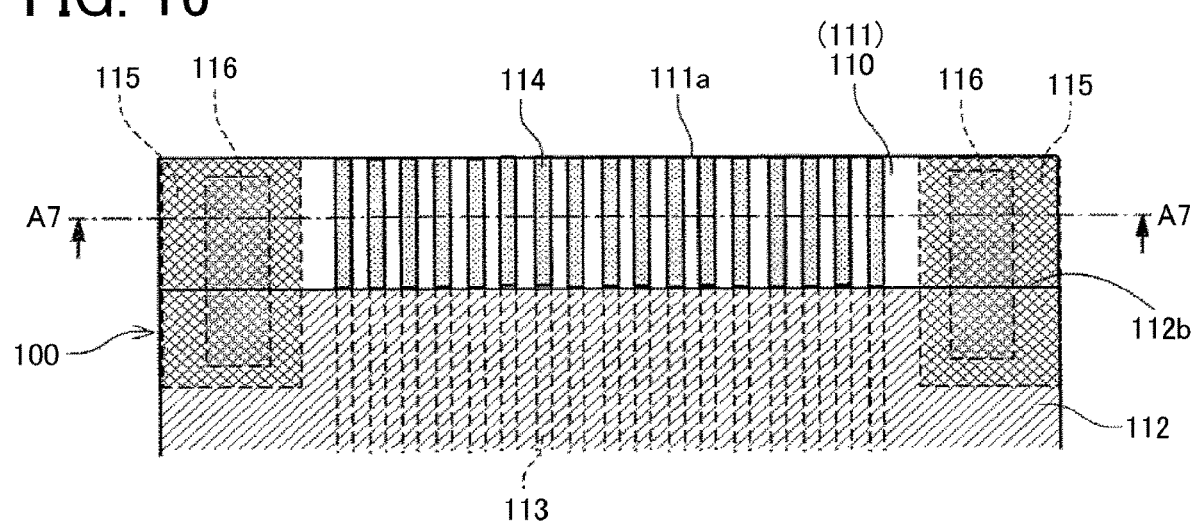
FIG. 16 is a partial plan view of the flexible member according to a seventh embodiment of the present disclosure.
Figure 17:
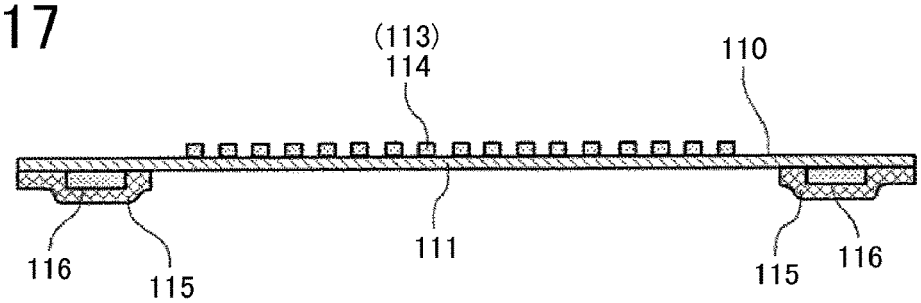
FIG. 17 is a cross-sectional view of the flexible member cut along line A7-A7 of FIG. 16.

Next, a seventh embodiment of the present disclosure is described with reference to FIGS. 16 and 17. FIG. 16 is a partial plan view of the flexible member according to the seventh embodiment. FIG. 17 is a cross-sectional view of the flexible member, cut along line A7-A7 of FIG. 16.

Similarly with the sixth embodiment, in the flexible member 100 according to the seventh embodiment, the first reinforcing portions 115 of the second member 112 are not provided on one surface of the first member 111 on which the plurality of conductor wires 113 is disposed. The second member 112 has a distal end 112b corresponding to the position of the extension line 118 of the first embodiment.

Thus, the flexible member 100 includes a non-overlapping region 110 in which the second member 112 does not overlap the first member 111 when the flexible member 100 is projected from the direction perpendicular to the surface of the flexible member 100. The non-overlapping region 110 includes the edge portion 111a of the first member 111.

On the other surface of the first member 111, two first reinforcing portions 115 are disposed with a part of the non-overlapping region 110 interposed between the first reinforcing portions 115, and each of the second reinforcing portions 116 is disposed to overlap both of the first member 111 and the second member 112, when the flexible member 100 is projected from the direction perpendicular to the surface of the flexible member 100.

Here, the first reinforcing portion 115 extends to a position at which a part of the first reinforcing portion 115 overlaps the second member 112 when the flexible member 100 is projected from the direction perpendicular to the surface of the flexible member 100.

As described above, in a case in which the first reinforcing portions 115 are disposed on the surface opposite to the second member 112, the first reinforcing portion 115 and the second member 112 are disposed to overlap when the flexible member 100 is projected from the direction perpendicular to the surface of the flexible member 100. Such a configuration can enhance the reinforcing effect of the first reinforcing portions 115 and more effectively suppress the warp of the flexible member 100 than in the sixth embodiment.

Figure 18:
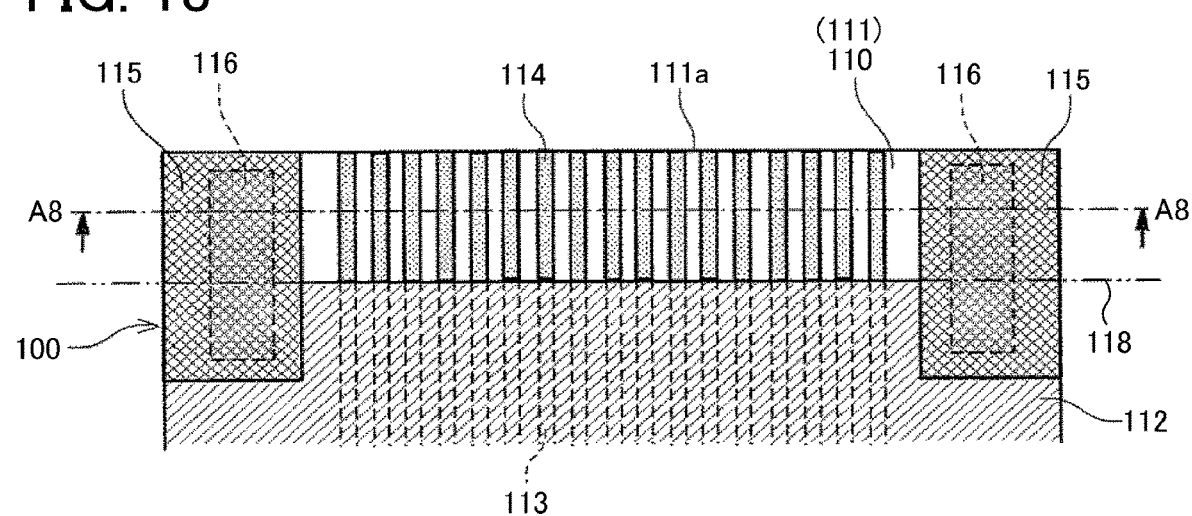
FIG. 18 is a partial plan view of the flexible member according to a eighth embodiment of the present disclosure.
Figure 19:
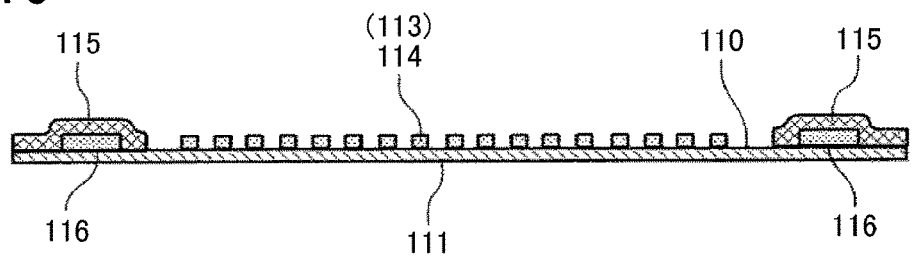
FIG. 19 is a cross-sectional view of the flexible member cut along line A8-A8 of FIG. 18.

Next, an eighth embodiment of the present disclosure is described with reference to FIGS. 18 and 19. FIG. 18 is a partial plan view of the flexible member according to the eighth embodiment. FIG. 19 is a cross-sectional view of the flexible member, cut along line A8-A8 of FIG. 18.

In the flexible member 100 according to the eighth embodiment, the first reinforcing portions 115 of the second member 112 are not provided on one surface of the first member 111 on which the plurality of conductor wires 113 is disposed. The second member 112 has a distal end 112b corresponding to the position of the extension line 118 of the first embodiment.

Thus, the flexible member 100 includes a non-overlapping region 110 in which the second member 112 does not overlap the first member 111 when the flexible member 100 is projected from the direction perpendicular to the surface of the flexible member 100. The non-overlapping region 110 includes the edge portion 111a of the first member 111.

On one surface of the first member 111 on which the second member 112 is disposed, the two first reinforcing portions 115 are disposed so that a part of the non-overlapping region 110 is interposed between the first reinforcing portions 115 when the flexible member 100 is projected from the direction perpendicular to the surface of the flexible member 100.

Here, the first reinforcing portion 115 extends to a position at which a part of the first reinforcing portion 115 overlaps the second member 112 when the flexible member 100 is projected from the direction perpendicular to the surface of the flexible member 100.

As the first reinforcing portion 115, for example, a polyimide film, a PET film, or a polyimide varnish can be used. The same member as the second member 112 disposed on the front surface can preferably be used, thus allowing application of the same manufacturing method and material and cost reduction.

On one surface of the first member 111 is disposed the second reinforcing portions 116, each of which overlaps the first reinforcing portion 115 and the second member 112 when the flexible member 100 is projected from the direction perpendicular to the surface of the flexible member 100.

Accordingly, as also described in the sixth embodiment and the seventh embodiment, the effect of suppressing the warp of the flexible member 100 can be enhanced.

Figure 20:
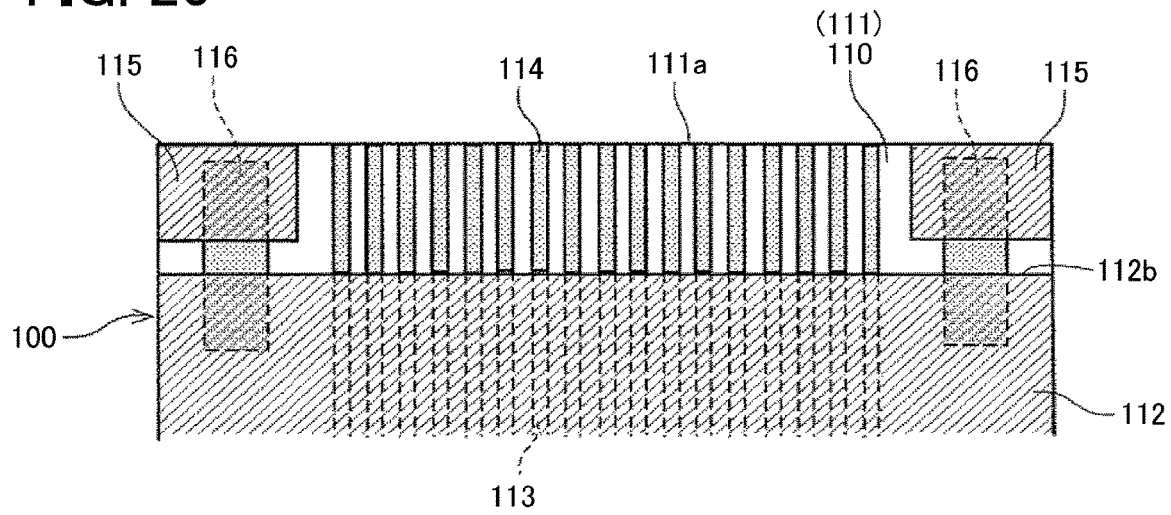
FIG. 20 is a partial plan view of the flexible member according to a ninth embodiment of the present disclosure.

Next, a ninth embodiment of the present disclosure is described with reference to FIG. 20. FIG. 20 is a partial plan view of the flexible member according to the ninth embodiment.

Similarly with the sixth embodiment, in the flexible member 100 according to the ninth embodiment, the first reinforcing portions 115 of the second member 112 are not provided on one surface of the first member 111 on which the plurality of conductor wires 113 is disposed. The second member 112 has a distal end 112b corresponding to the position of the extension line 118 of the first embodiment.

Thus, the flexible member 100 includes a non-overlapping region 110 in which the second member 112 does not overlap the first member 111 when the flexible member 100 is projected from the direction perpendicular to the surface of the flexible member 100. The non-overlapping region 110 includes the edge portion 111a of the first member 111.

On one surface of the first member 111 on which the second member 112 is disposed, the two first reinforcing portions 115 are disposed with a part of the non-overlapping region 110 interposed between the first reinforcing portions 115 and each of the second reinforcing portions 116 is disposed to overlap both of the first reinforcing portion 115 and the second member 112 when the flexible member 100 is projected from the direction perpendicular to the surface of the flexible member 100.

Here, each of the first reinforcing portions 115 is disposed at a position spaced apart from the distal end 112b of the second member 112.

Even when the first reinforcing portions 115 are spaced apart from the second member 112 as described above, the second reinforcing portions 116 can provide the effect of suppressing the warp of the flexible member 100.

Figure 21:
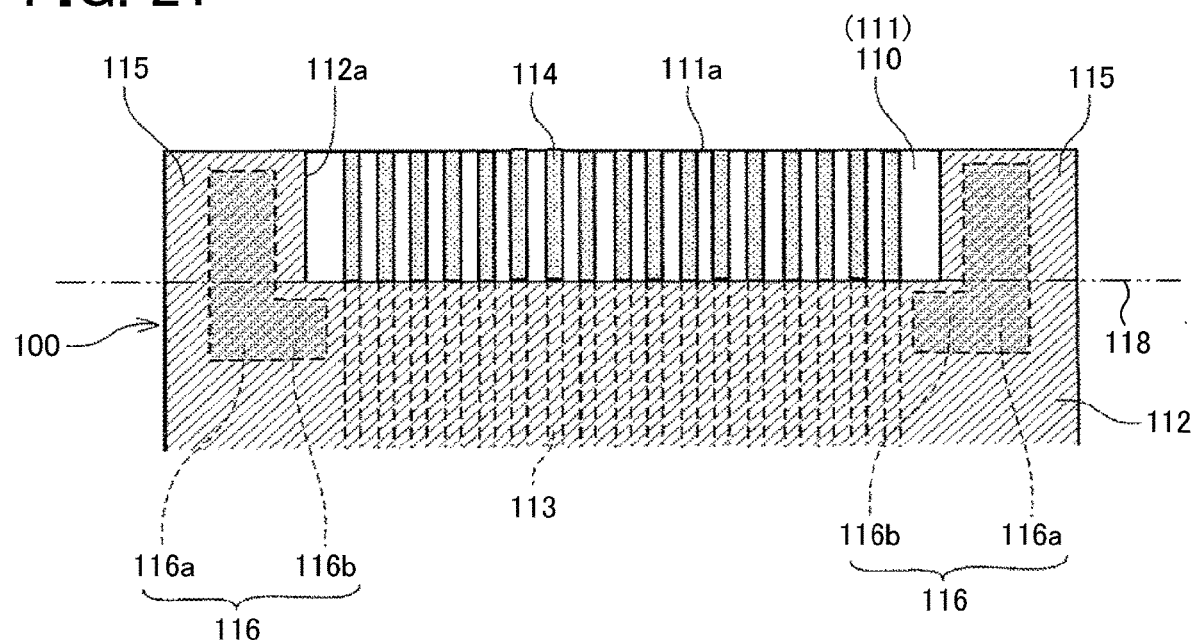
FIG. 21 is a partial plan view of the flexible member according to a tenth embodiment of the present disclosure.

Next, a tenth embodiment of the present disclosure is described with reference to FIG. 21. FIG. 21 is a partial plan view of the flexible member according to the tenth embodiment.

The second reinforcing portions 116 of the flexible member 100 has an L shape when the first member 111 is projected from the direction perpendicular to the surface of the flexible member 100. A part of each second reinforcing portion 116 extends to an area opposite to the recess 112a of the second member 112 across the extension line 118.

In other words, the second reinforcing portion 116 includes a first portion 116a and a second portion 116b. The first portion 116a extends in the extending direction of the terminal portion 114 of the conductor wire 113 and overlaps both of the second member 112 and the first reinforcing portion 115 across the extension line 118 of extending a boundary line of the second member 112. The second portion 116b extends from an end of the first portion 116a in a direction intersecting with the extending direction of the terminal portion 114 of the conductor wire 113 and overlaps the second member 112.

Such a configuration allows the second reinforcing portion 116 to have a greater width than in the first embodiment, thus relatively enhancing the effect of suppressing the warp of the flexible member 100.

Note that the configuration of the second reinforcing portion 116 according to the present embodiment can be applied to any of the first to ninth embodiments.

Figure 22:
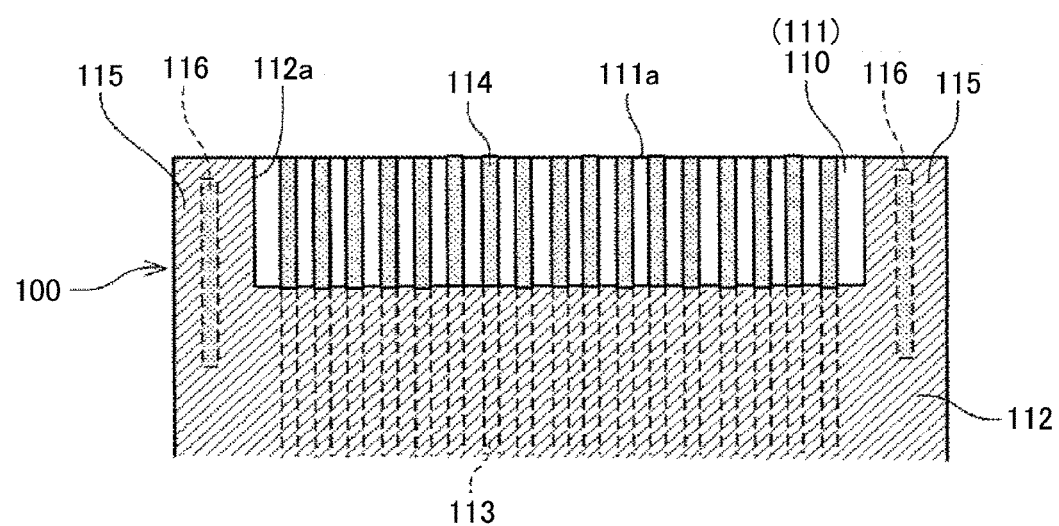
FIG. 22 is a partial plan view of the flexible member according to an eleventh embodiment of the present disclosure.

Next, an eleventh embodiment of the present disclosure is described with reference to FIG. 22. FIG. 22 is a partial plan view of the flexible member according to the eleventh embodiment.

In the flexible member 100 according to the eleventh embodiment, the second reinforcing portion 116 has the same width (including substantially the same, which is the same hereinafter) as the width of the terminal portion 114 of the conductor wire 113.

Such a configuration allows the second reinforcing portion 116 to be formed in the same conductor pattern as the conductor pattern of the conductor wire 113, thus facilitating formation of the second reinforcing portion 116.

In addition, as compared with the configuration in which, as in the first embodiment, the second reinforcing portion 116 has a thicker conductor pattern (wider pattern) than in the present embodiment, the second reinforcing portion 116 according to the present embodiment can reduce the distortion of the flexible member 100 caused by the difference in thermal shrinkage rate between the second reinforcing portion 116 and the first member 111.

Figure 23:
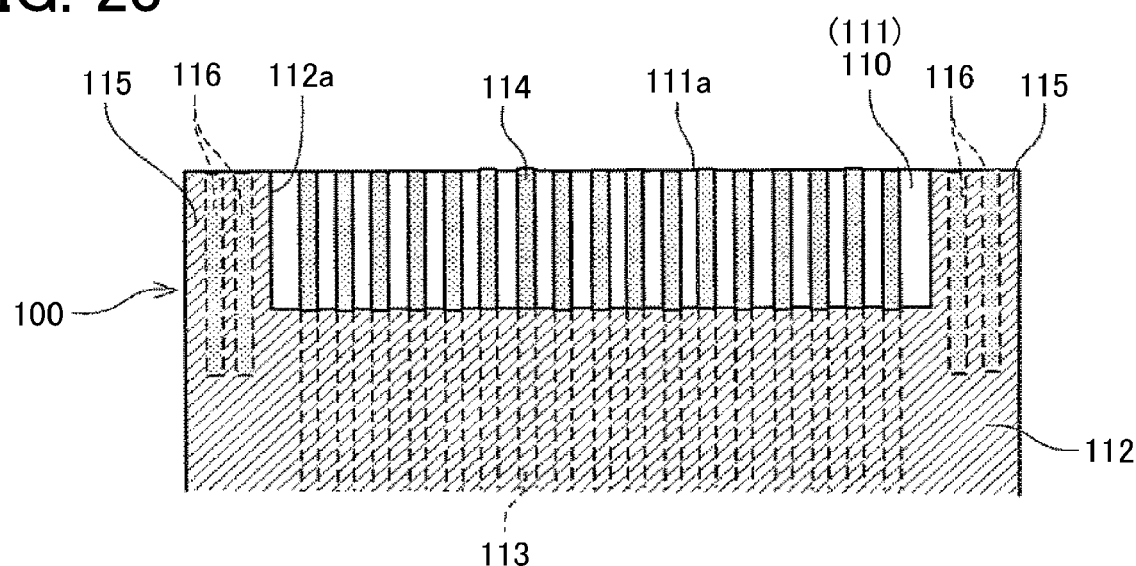
FIG. 23 is a partial plan view of the flexible member according to a twelfth embodiment of the present disclosure.

Next, a twelfth embodiment of the present disclosure is described with reference to FIG. 23. FIG. 23 is a partial plan view of the flexible member according to the twelfth embodiment.

The flexible member 100 according to the twelfth embodiment includes two second reinforcing portions 116 at each side in the terminal-portion arrangement direction. Each of the second reinforcing portions 116 has the same width as the width of the terminal portion 114 of the conductor wire 113. Note the number of second reinforcing portions 116 may be three or more.

In such a case, the arrangement interval between two adjacent second reinforcing portions 116 in the conductor pattern is set to be equal to the arrangement interval between the terminal portions 114 of the conductor wires 113.

Such a configuration allows the second reinforcing portion 116 to be formed in the same conductor pattern as the conductor pattern of the conductor wire 113, thus facilitating formation of the second reinforcing portion 116. Such a configuration can also more enhance the effect of suppressing the warp than the configuration of the eleventh embodiment in which one second reinforcing portion 116 is disposed at each side of the flexible member 100 in the terminal-portion arrangement direction.

Figure 24:
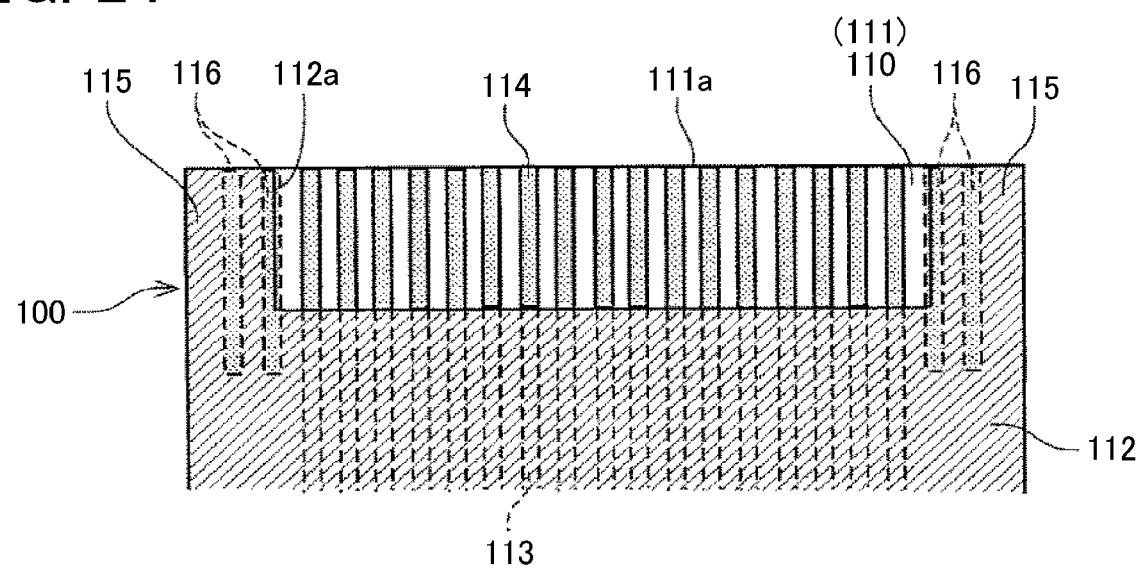
FIG. 24 is a partial plan view of the flexible member according to a thirteenth embodiment of the present disclosure.

Next, a thirteenth embodiment of the present disclosure is described with reference to FIG. 24. FIG. 24 is a partial plan view of the flexible member according to the thirteenth embodiment.

The flexible member 100 according to the thirteenth embodiment includes two second reinforcing portions 116 at each side in the terminal-portion arrangement direction. Each of the second reinforcing portions 116 has the same width as the width of the terminal portion 114 of the conductor wire 113. Note the number of second reinforcing portions 116 may be three or more.

A portion of one of the two second reinforcing portions 116 extends over a region of the first member 111 in which the conductor wires 113 are arranged.

The difference from the twelfth embodiment illustrated in FIG. 23 is that the arrangement interval between the conductor pattern constituting the second reinforcing portions 116 at an end portion in the terminal-portion arrangement direction and the conductor wire 113 located at the end portion is also the same as the arrangement interval between the terminal portions 114 of the conductor wires 113. Accordingly, a portion of one of the two second reinforcing portions 116 extends over a region of the first member 111 in which the conductor wires 113 are arranged.

The arrangement of the terminal portions 114 of the conductor wires 113 and the second reinforcing portions 116 at the same arrangement interval can more reduce distortion in the terminal-portion arrangement direction or irregular bending than a configuration in which the terminal portions 114 of the conductor wires 113 and the second reinforcing portions 116 are arranged at different arrangement intervals.

Figure 25:
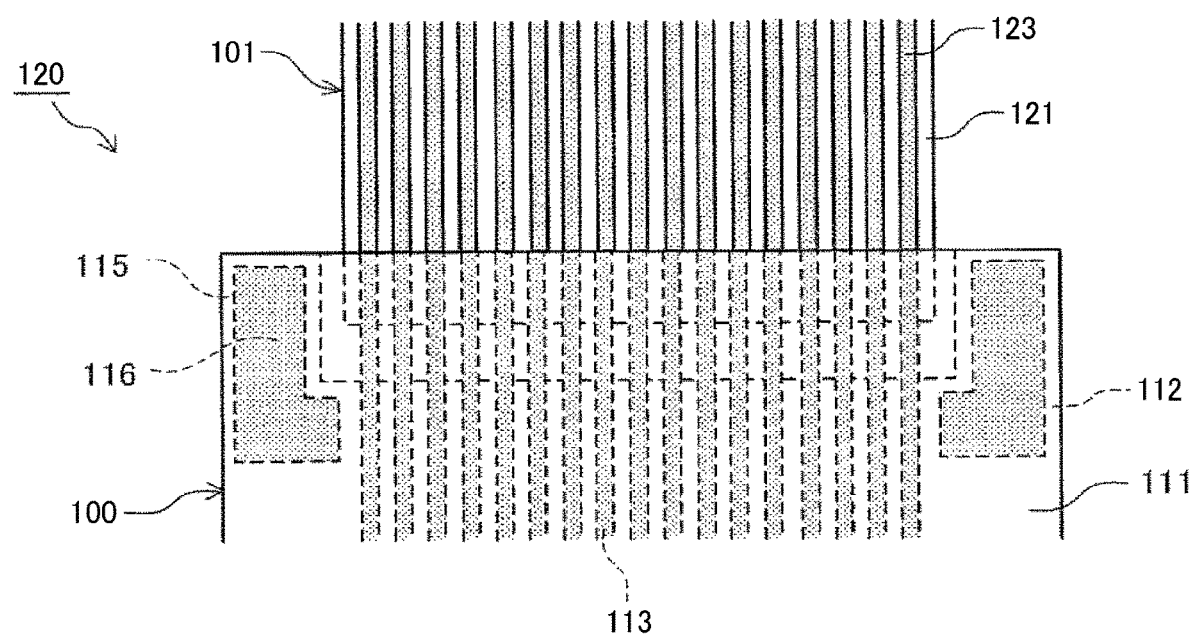
FIG. 25 is a partial plan view of the flexible member according to a fourteenth embodiment of the present disclosure.

Next, a fourteenth embodiment of the present disclosure is described with reference to FIG. 25. FIG. 25 is a partial plan view of a wiring member according to the fourteenth embodiment.

A wiring member 120 according to the fourteenth embodiment is configured by connecting the flexible member 100 and another connecting member 101. Although the flexible member 100 is illustrated using the example of the above-described tenth embodiment (FIG. 21), the flexible member 100 is not limited to the example of the tenth embodiment and may be the flexible member 100 according to another embodiment. Although a flexible member is used as the connecting member 101 in the present embodiment, the connecting member 101 may be a rigid wiring member.

The flexible member 100 is a flexible member according to an embodiment of the present disclosure. The connecting member 101 includes a plurality of conductor wires 123 on a base member 121. The conductor wires 113 of the flexible member 100 are connected to the conductor wires 123 of the connecting member 101.

Thus, since the warp of the flexible member 100 is suppressed, the flexible member 100 can be accurately and reliably connected to the connecting member 101.

In the present embodiment, the second reinforcing portions 116 of the flexible member 100 are not connected to any of the conductor wires 123 of the connecting member 101.

Figure 26:
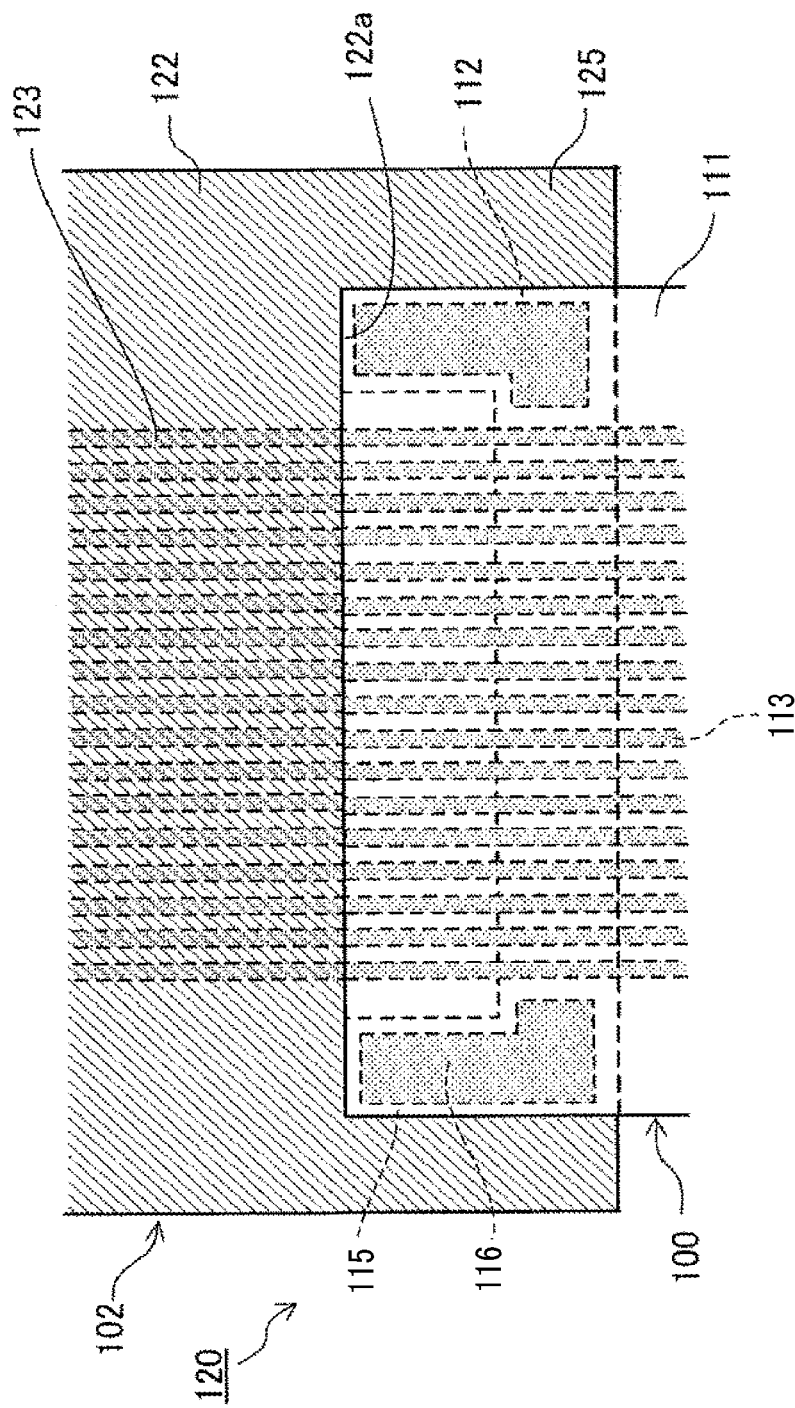
FIG. 26 is a partial plan view of the flexible member according to a fifteenth embodiment of the present disclosure.

Next, a fifteenth embodiment of the present disclosure is described with reference to FIG. 26. FIG. 26 is a partial plan view of a wiring member according to the fifteenth embodiment.

The wiring member 120 is configured by connecting the flexible member 100 and a connecting member 102. Although the flexible member 100 is illustrated using the example of the above-described tenth embodiment (FIG. 21), the flexible member 100 is not limited to the example of the tenth embodiment and may be the flexible member 100 according to another embodiment. In the present embodiment, a flexible member is used as the connecting member 102. In some embodiments, the connecting member 102 may be a rigid wiring member.

The flexible member 100 is a flexible member according to an embodiment of the present disclosure. The connecting member 102 includes a plurality of conductor wires 123 on the base member 121. The plurality of conductor wires 123 is covered with a cover member 122, and the cover member 122 has a recess 122a. Reinforcing portions 125 integral with the cover member 122 are disposed at both end portions in a direction in which the conductor wires 123 are arranged side by side.

The conductor wires 113 of the flexible member 100 are connected to the conductor wires 123 of the connecting member 102. In such a case, the conductor wires 113 of the flexible member 100 are connected to the conductor wires 123 of the connecting member 102 in a state in which all of the second reinforcing portions 116 overlap the connecting member 102 when the flexible member 100 is projected from the direction perpendicular to the surface of the flexible member 100.

With such a configuration, when the connecting member 102 is a flexible member, the reinforcing portions 125 exert the effect of suppressing the warp of the flexible member 100. Accordingly, the warp of the entire wiring member 120 can be suppressed, thus allowing the flexible member 100 to be accurately and reliably connected to the connecting member 102.

Figure 27:
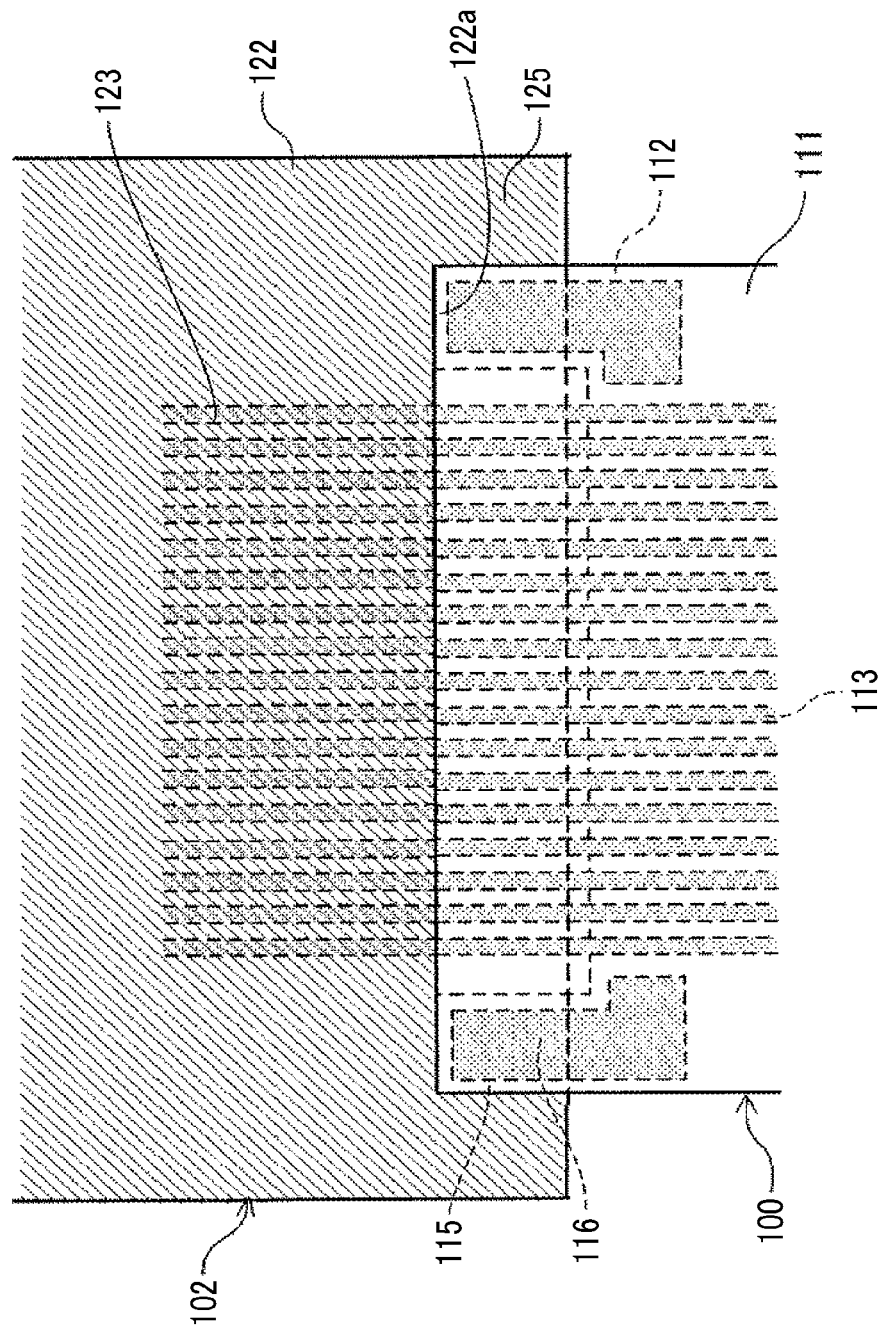
FIG. 27 is a partial plan view of the flexible member according to a sixteenth embodiment of the present disclosure.

Next, a sixteenth embodiment of the present disclosure is described with reference to FIG. 27. FIG. 27 is a partial plan view of a wiring member according to the sixteenth embodiment.

The wiring member 120 is configured by connecting the flexible member 100 and the connecting member 102. The sixteenth embodiment is different from the fifteenth embodiment in that the flexible member 100 is connected to the connecting member 102 in a state in which each of the second reinforcing portions 116 of the flexible member 100 overlaps a part of the connecting member 102 when the flexible member 100 is projected from the direction perpendicular to the surface of the flexible member 100.

Even with such a configuration, the same operational effect as the operational effect of the fifteenth embodiment can be obtained.

Figure 28:
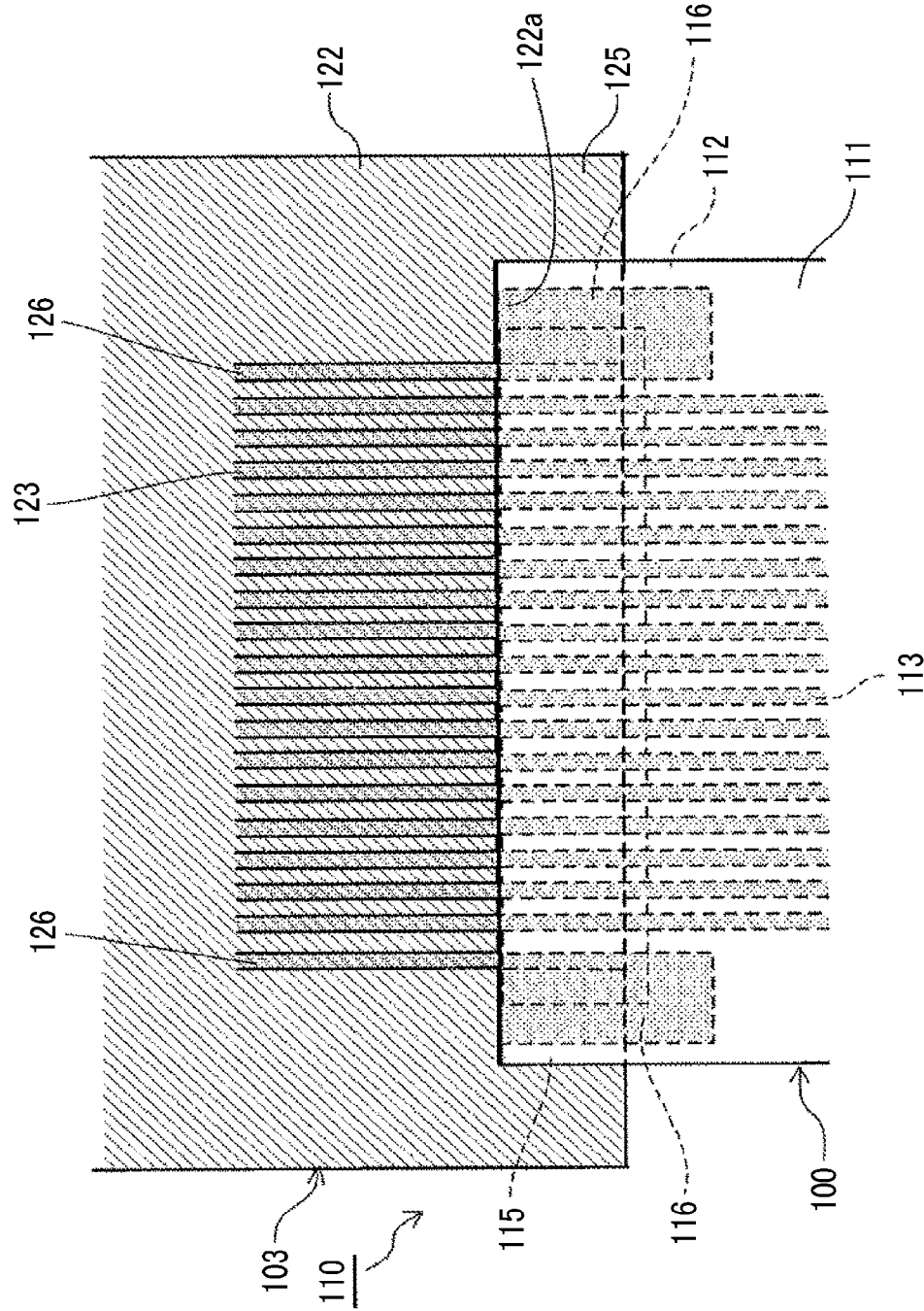
FIG. 28 is a partial plan view of the flexible member according to a seventeenth embodiment of the present disclosure.

Next, a seventeenth embodiment of the present disclosure is described with reference to FIG. 28. FIG. 28 is a partial plan view of a wiring member according to the seventeenth embodiment.

The wiring member 120 is configured by connecting the flexible member 100 and a connecting member 103. In such a case, the flexible member 100 is connected to the connecting member 103 in a state in which each of the second reinforcing portions 116 overlaps a part of the connecting member 103 when the flexible member 100 is projected from the direction perpendicular to the surface of the flexible member 100. In the present embodiment, a flexible member is used as the connecting member 103. In some embodiments, the connecting member 103 may be a rigid wiring member.

On the connecting member 103, dummy wires 126 not used for transmission of electric signals and power supply are disposed on both sides of the arrangement direction of the plurality of conductor wires 123. The dummy wires 126 are connected to the second reinforcing portions 116 of the flexible member 100.

Connecting the second reinforcing portions 116 of the flexible member 100 to the dummy wires 126 of the connecting member 103 can further effectively suppress the warp of the entire flexible member 100.

In each of the above-described embodiments, the second reinforcing portion 116 is described as an example of the conductor pattern. In some embodiments, the second reinforcing portion 116 may have a structure in which a metal plate or a resin plate is pasted to the first member 111 with an adhesive.

In each of the above-described embodiments, an example is described in which the conductor wires are disposed in a region (non-overlapping region) in which the second member does not overlap the first member. In some embodiments, the present invention can be applied to a configuration in which the conductor wires are not disposed in the non-overlapping region.

Figure 29:
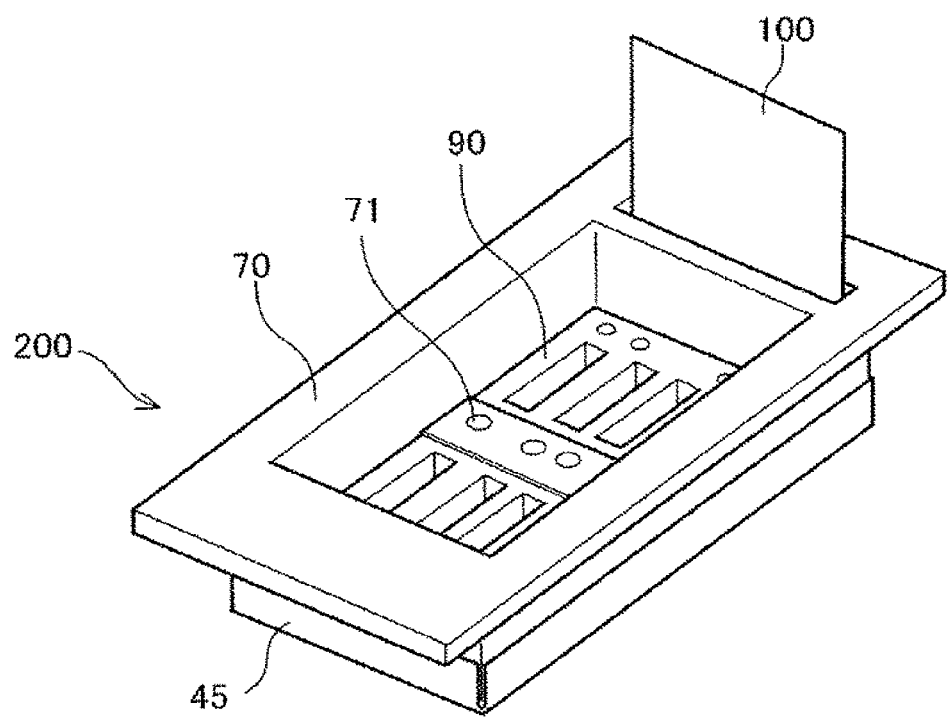
FIG. 29 is a perspective view of a liquid discharge head according to an embodiment of the present disclosure.
Figure 30:
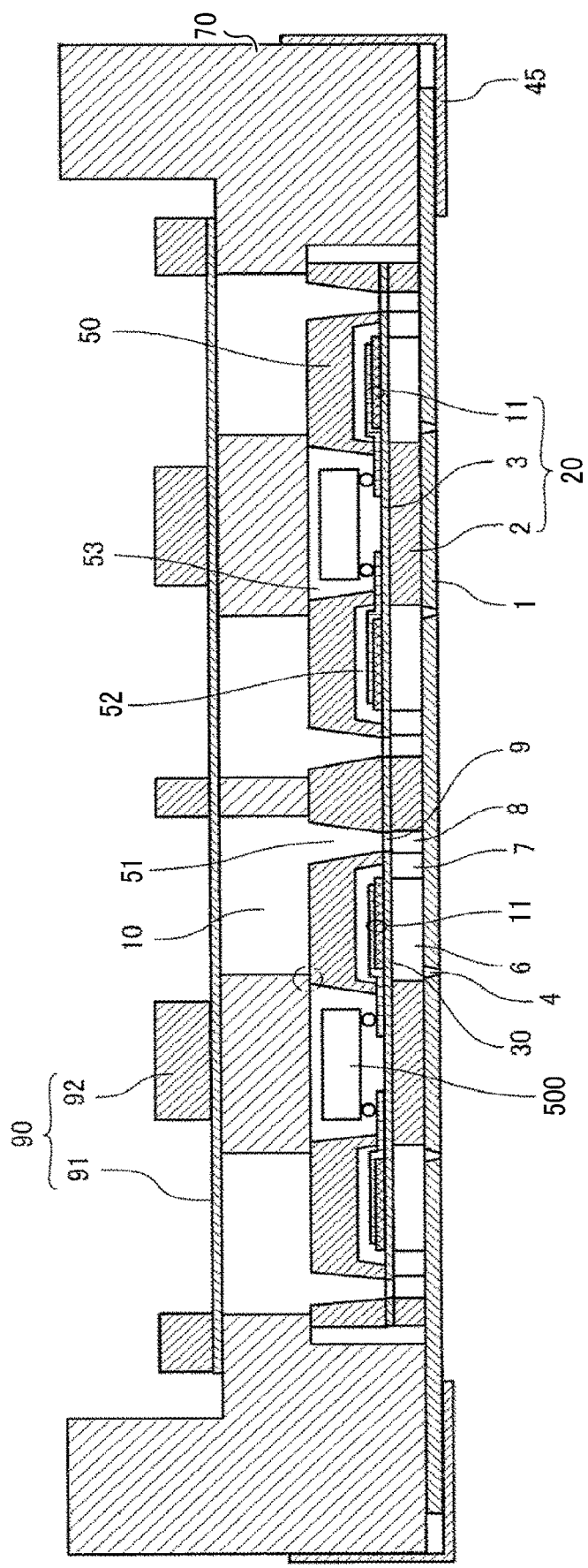
FIG. 30 is a cross-sectional view of the liquid discharge head of FIG. 29 cut along a direction perpendicular to a nozzle array direction in which nozzles are arrayed in row.
Figure 31:
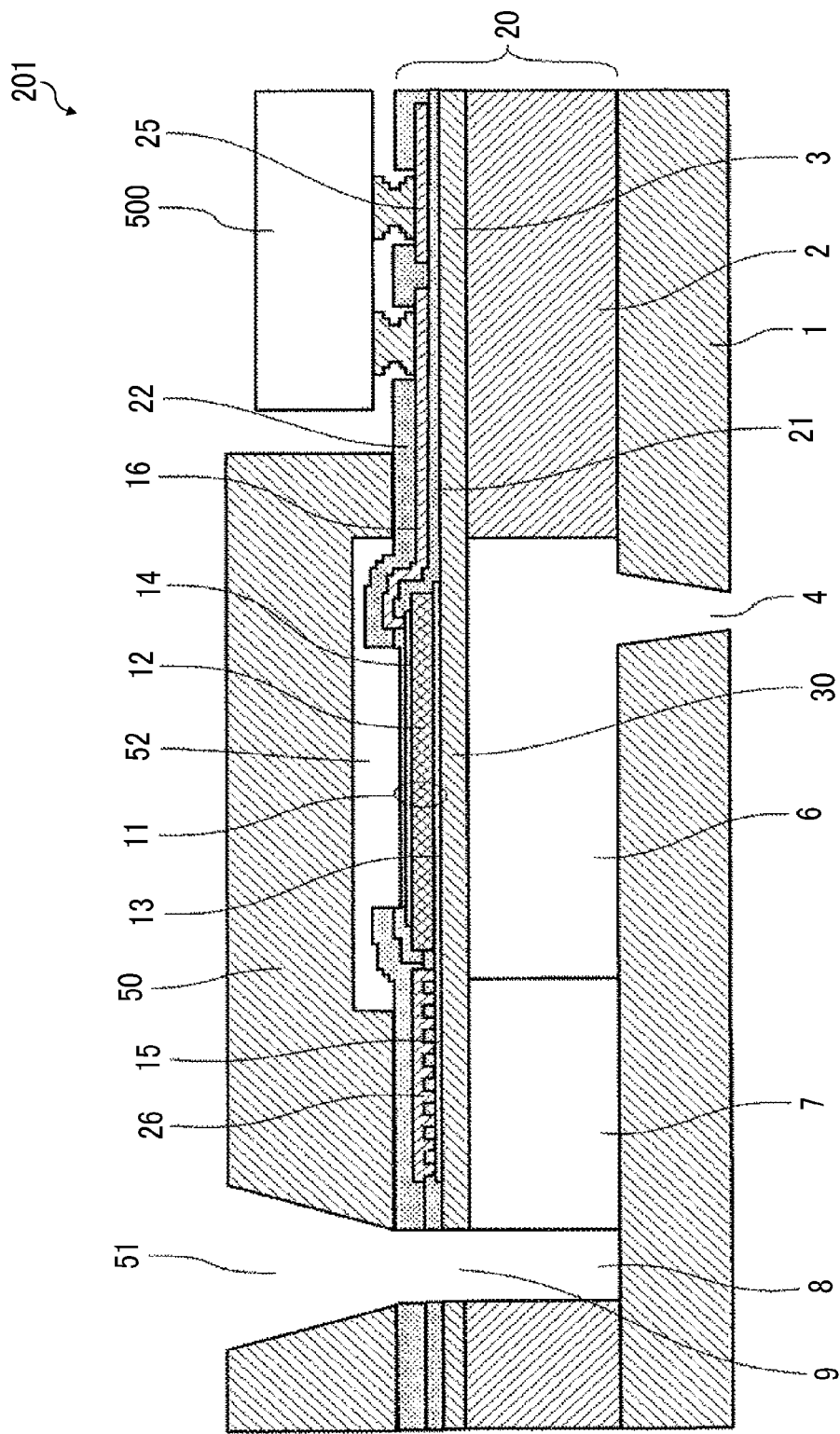
FIG. 31 is an enlarged cross-sectional view of a portion of the liquid discharge head of FIG. 30.
Figure 32:
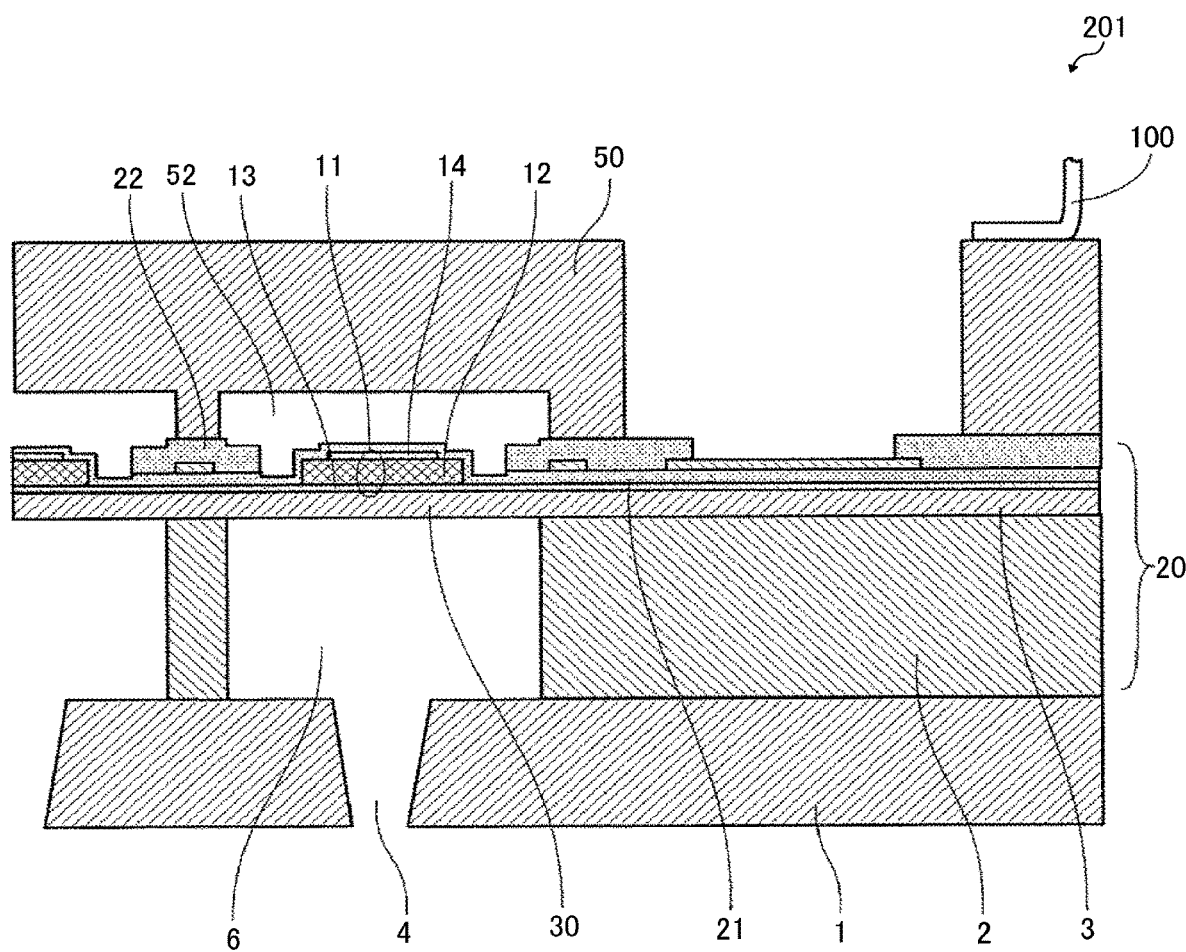
FIG. 32 is a cross-sectional view of a portion of the liquid discharge head of FIG. 30 cut along the nozzle array direction.

Next, an example of a liquid discharge head according to an embodiment of the present disclosure is described with reference to FIGS. 29 to 32. FIG. 29 is a perspective view of the liquid discharge head according to an embodiment of the present disclosure. FIG. 30 is a cross-sectional view of the liquid discharge head of FIG. 29 cut along a direction perpendicular to a nozzle array direction in which nozzles are arrayed in row. FIG. 31 is an enlarged cross-sectional view of a portion of the liquid discharge head of FIG. 30. FIG. 32 is a cross-sectional view of a portion of the liquid discharge head of FIG. 30 cut along the nozzle array direction.

A liquid discharge head 200 according to the present embodiment includes a nozzle plate 1, a channel plate 2, a diaphragm plate 3 being a wall member, piezoelectric elements 11 being pressure generating elements, a holding substrate 50, and the flexible member 100, such as an FPC, a common liquid chamber substrate 70, and a cover 45.

In the present embodiment, the channel plate 2, the diaphragm plate 3, and the piezoelectric elements 11 constitute an actuator board 20.

The nozzle plate 1 includes a plurality of nozzles 4 to discharge liquid. In the present embodiment, the nozzles 4 are arrayed in four rows.

With the nozzle plate 1 and the diaphragm plate 3, the channel plate 2 forms individual liquid chambers 6 communicated with the nozzles 4, fluid restrictors 7 communicated with the individual liquid chambers 6, and liquid introduction portions 8 communicated with the fluid restrictors 7.

The liquid introduction portion 8 communicates with a common liquid chamber 10, which is formed by the common liquid chamber substrate 70, via an opening 9 of the diaphragm plate 3 and an opening portion 51 serving as a channel of the holding substrate 50.

The diaphragm plate 3 includes deformable vibration portions 30 forming part of walls of the individual liquid chambers 6. The piezoelectric element 11 is disposed integrally with the vibration portion 30 on a surface of the vibration portion 30 of the diaphragm plate 3 opposite the individual liquid chamber 6. The vibration portion 30 and the piezoelectric element 11 form a piezoelectric actuator.

In the piezoelectric element 11, a lower electrode 13, a piezoelectric layer (piezoelectric body) 12, and an upper electrode 14 are laminated in this order from the vibration portion 30. An insulation film 21 is disposed on the piezoelectric element 11.

The lower electrode 13 as a common electrode for the plurality of piezoelectric elements 11 is connected to a common-electrode power-supply wiring pattern 26 via a common wire 15. The lower electrode 13 is one electrode layer formed across all the piezoelectric elements 11 in the nozzle array direction.

The upper electrodes 14 as discrete electrodes for the piezoelectric elements 11 are connected to a drive integrated circuit (IC) 500 (driver IC 500) as a drive circuit via individual wires 16. The individual wire 16 is covered with an insulation film 22.

The driver IC 500 is mounted on the actuator board 20 by, e.g., a flip-chip bonding method, to cover an area between rows of the piezoelectric elements 11.

The driver IC 500 mounted on the actuator board 20 is connected to a discrete-electrode power-supply wiring pattern 25 to which a drive waveform (drive signal) is supplied.

The conductor wires 113 on the flexible member 100 are electrically connected to the driver IC 500 and the wiring pattern. The other end side of the flexible member 100 is electrically connected to a controller on a device body side via another flexible member as needed.

The holding substrate 50 covering the piezoelectric element 11 on the actuator board 20 is bonded, with adhesive, to one side of the actuator board 20 in which the diaphragm plate 3 is disposed.

The holding substrate 50 is provided with the opening portion 51, which is a part of a channel communicating the common liquid chamber 10 with a side of the individual liquid chamber 6, a recessed portion 52 that accommodates the piezoelectric element 11, and an opening portion 53 that accommodates the driver IC 500. The opening portion 51 is a slit-shaped through hole extending in the nozzle array direction and constitutes part of the common liquid chamber 10 in the present embodiment.

The holding substrate 50 is interposed between the actuator board 20 and the common liquid chamber substrate 70 and forms part of a wall surface of the common liquid chamber 10.

The common liquid chamber substrate 70 forms the common liquid chamber 10 that supplies liquid to each individual liquid chamber 6. Note that, in the present embodiment, the four common liquid chambers 10 are disposed corresponding to the four nozzle rows. In addition, liquid of a required color is supplied to the common liquid chamber 10 via a supply port portion 71 communicated with a liquid supply member.

A damper unit 90 is joined to the common liquid chamber substrate 70. The damper unit 90 includes a damper 91 and damper plates 92. The damper 91 is deformable and forms part of wall faces of the common liquid chambers 10. The damper plates 92 reinforce the damper 91.

The common liquid chamber substrate 70 is bonded to the holding substrate 50 and an outer peripheral portion of the nozzle plate 1 with adhesive, to accommodate the actuator substrate 20 and the holding substrate 50, thus forming a frame of the liquid discharge head 200.

The liquid discharge head 200 includes the cover 45 to cover a peripheral area of the nozzle plate 1 and a part of an outer circumferential face of the common liquid chamber substrate 70.

In a head body 201 of the liquid discharge head 200, voltage is applied from the driver IC 500 to a portion between the upper electrode 14 and the lower electrode 13 of the piezoelectric element 11. Accordingly, the piezoelectric layer 12 expands in an electrode lamination direction (in other words, an electric-field direction) in which the upper electrode 14 and the lower electrode 13 are laminated, and contracts in a direction parallel to the vibration portion 30. Thus, tensile stress arises at a side (hereinafter, lower electrode 13 side) of the vibration portion 30 facing the lower electrode 13, causing the vibration portion 30 to bend toward a side (hereinafter, individual liquid chamber 6 side) of the vibration portion 30 facing the individual liquid chamber 6. Accordingly, liquid within the individual liquid chamber 6 is pressurized and discharged from the nozzle 4.

Figure 33:
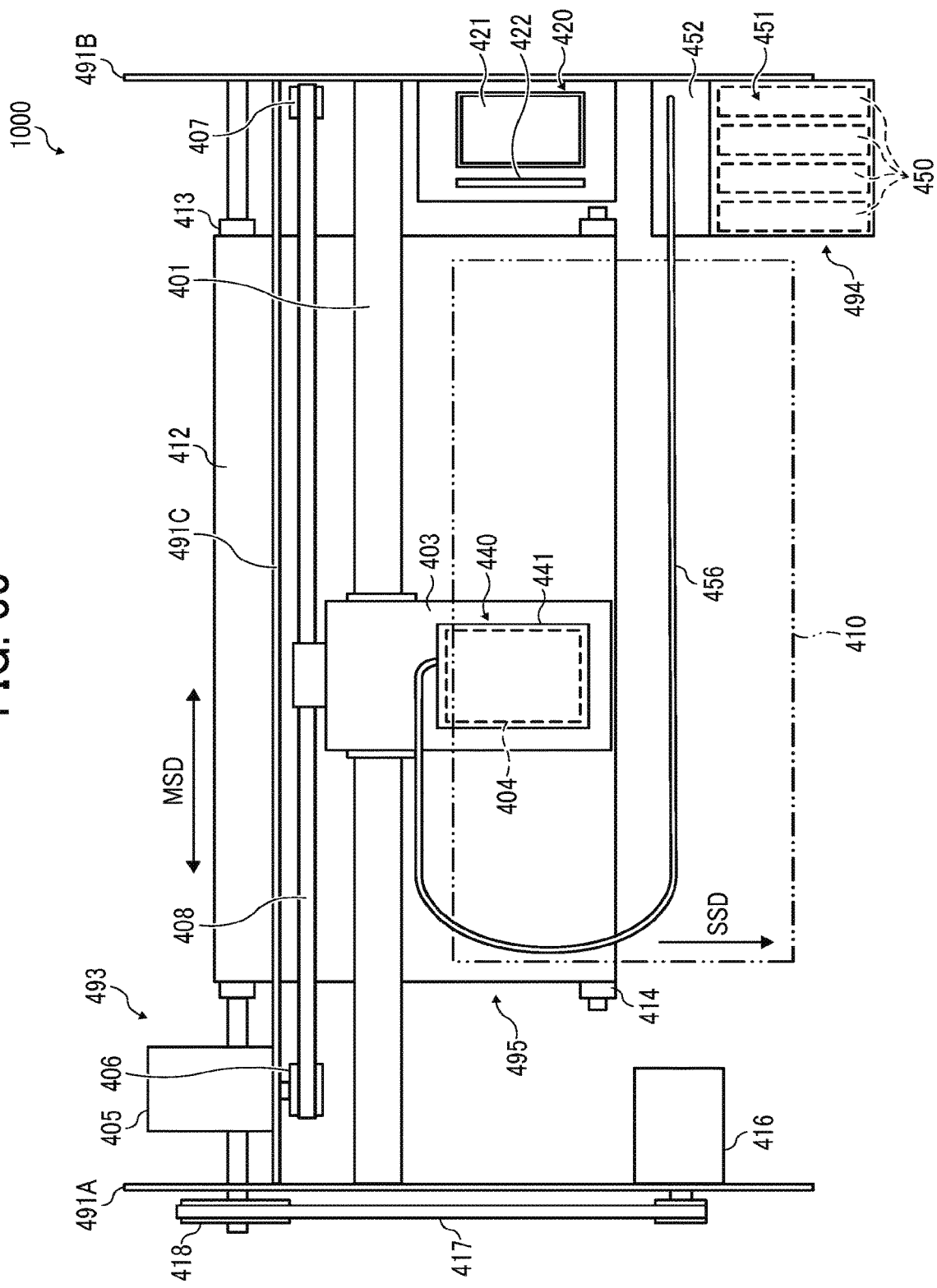
FIG. 33 is a plan view of a portion of a liquid discharge apparatus including a liquid discharge device according to an embodiment of the present disclosure.
Figure 34:
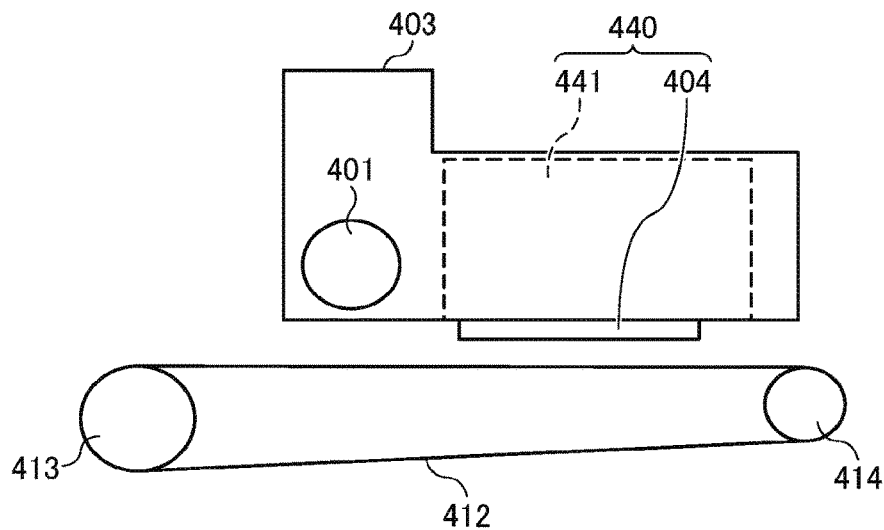
FIG. 34 is a side view of a portion of the liquid discharge apparatus of FIG. 33.

Next, a liquid discharge apparatus according to an embodiment of the present disclosure is described with reference to FIGS. 33 and 34. FIG. 33 is a plan view of a part of the liquid discharge apparatus according to an embodiment of the present disclosure. FIG. 34 is a side view of a part of the liquid discharge apparatus of FIG. 33.

A liquid discharge apparatus 1000 according to the present embodiment is a serial-type apparatus in which a main scan moving unit 493 reciprocally moves a carriage 403 in a main scanning direction indicated by arrow MSD in FIG. 33. The main scan moving unit 493 includes, for example, a guide member 401, a main scanning motor 405, and a timing belt 408. The guide 401 is bridged between a left side plate 491A and a right side plate 491B, to movably hold the carriage 403. The main scanning motor 405 reciprocally moves the carriage 403 in the main scanning direction MSD via the timing belt 408 bridged between a driving pulley 406 and a driven pulley 407.

The carriage 403 mounts a liquid discharge device 440 in which a liquid discharge head 404 according to an embodiment of the present disclosure and a head tank 441 are integrated as a single unit. The liquid discharge head 404 of the liquid discharge device 440 discharges liquid of different colors, for example, yellow (Y), cyan (C), magenta (M), and black (K). The liquid discharge head 404 includes nozzle arrays 404a, 404b, 404c, and 404d, each including a plurality of nozzles 4 arrayed in row in a sub-scanning direction, which is indicated by arrow SSD in FIG. 33, perpendicular to the main scanning direction MSD. The liquid discharge head 404 is mounted to the carriage 403 so that ink droplets are discharged downward.

The liquid stored in liquid cartridges 450 are supplied to the head tank 441 by a supply unit 494 for supplying the liquid stored outside the liquid discharge head 404 to the liquid discharge head 404.

The supply unit 494 includes a cartridge holder 451 which is a filling section for mounting the liquid cartridges 450, a tube 456, a liquid feed unit 452 including a liquid feed pump, and the like. The liquid cartridges 450 are detachably attached to the cartridge holder 451. The liquid is supplied to the head tank 441 by the liquid feed unit 452 via the tube 456 from the liquid cartridges 450.

The liquid discharge apparatus 1000 includes a conveyance unit 495 to convey a sheet 410. The conveyance unit 495 includes a conveyance belt 412 to convey the sheet 410 and a sub-scanning motor 416 to drive the conveyance belt 412.

The conveyance belt 412 attracts the sheet 410 and conveys the sheet 410 at a position facing the liquid discharge head 404. The conveyance belt 412 is an endless belt and is stretched between a conveyance roller 413 and a tension roller 414. The sheet 410 can be attracted to the conveyance belt 412 by electrostatic adsorption, air suction, or the like.

The conveyance roller 413 is driven and rotated by the sub-scanning motor 416 via a timing belt 417 and a timing pulley 418, so that the conveyance belt 412 circulates in the sub-scanning direction SSD.

At one side in the main scanning direction MSD of the carriage 403, a maintenance unit 420 to maintain and recover the liquid discharge head 404 in good condition is disposed on a lateral side of the conveyance belt 412.

The maintenance unit 420 includes, for example, a cap 421 to cap a nozzle face (i.e., a face on which the nozzles 4 are formed) of the liquid discharge head 404 and a wiper 422 to wipe the nozzle face.

The main scan moving unit 493, the supply unit 494, the maintenance unit 420, and the conveyance unit 495 are mounted to a housing that includes the left side plate 491A, the right side plate 491B, and a rear side plate 491C.

In the liquid discharge apparatus 1000 thus configured, the sheet 410 is conveyed on and attracted to the conveyance belt 412 and is conveyed in the sub-scanning direction SSD by the cyclic rotation of the conveyance belt 412.

The liquid discharge head 404 is driven in response to image signals while the carriage 403 moves in the main scanning direction MSD, to discharge liquid to the sheet 410 stopped, thus forming an image on the sheet 410.

As described above, the liquid discharge apparatus 1000 includes the liquid discharge head 404 according to an embodiment of the present disclosure, thus allowing stable formation of high quality images.

Figure 35:
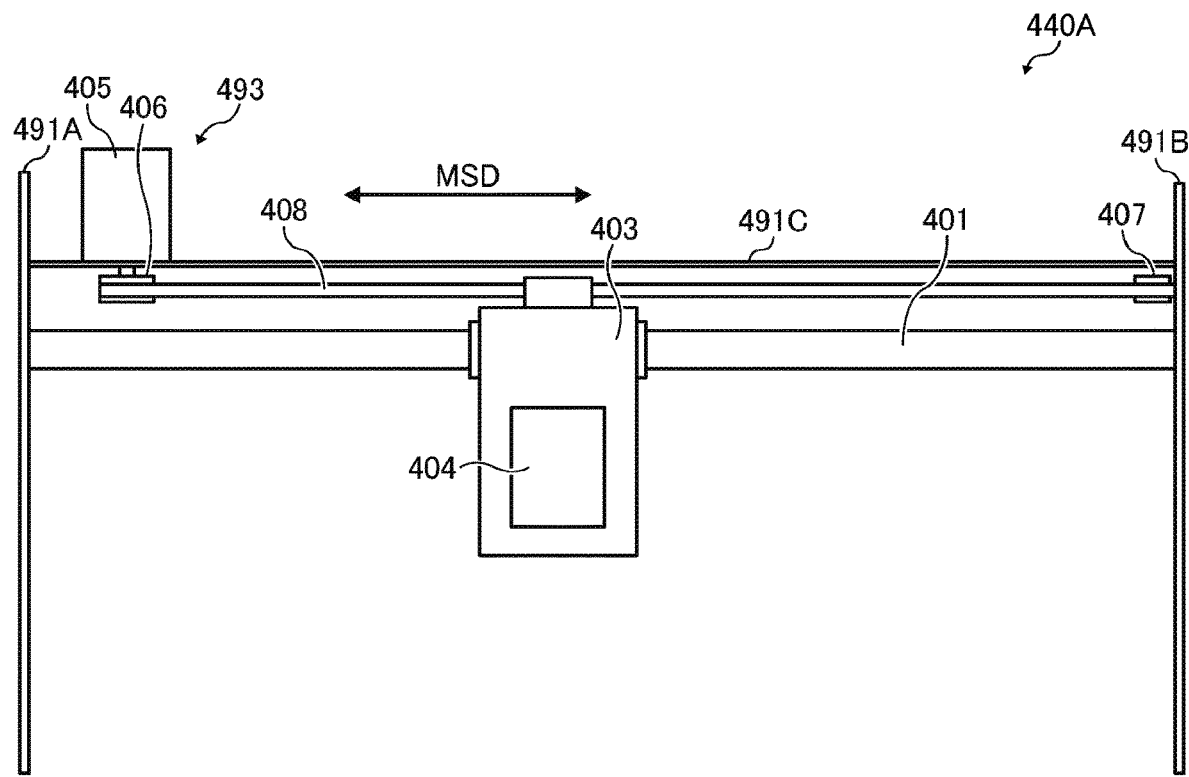
FIG. 35 is a plan view of a portion of the liquid discharge device according to another embodiment of the present disclosure.

Next, the liquid discharge device according to another embodiment of the present disclosure is described with reference to FIG. 35. FIG. 35 is a plan view of a portion of the liquid discharge device 440A according to another embodiment of the present disclosure.

The liquid discharge device 440A includes the housing, the main scan moving unit 493, the carriage 403, and the liquid discharge head 404 among components of the liquid discharge apparatus 1000. The left side plate 491A, the right side plate 491B, and the rear side plate 491C constitute the housing.

Note that, in the liquid discharge device 440A, at least one of the maintenance unit 420 and the supply unit 494 described above may be mounted on, for example, the right side plate 491B.

Figure 36:
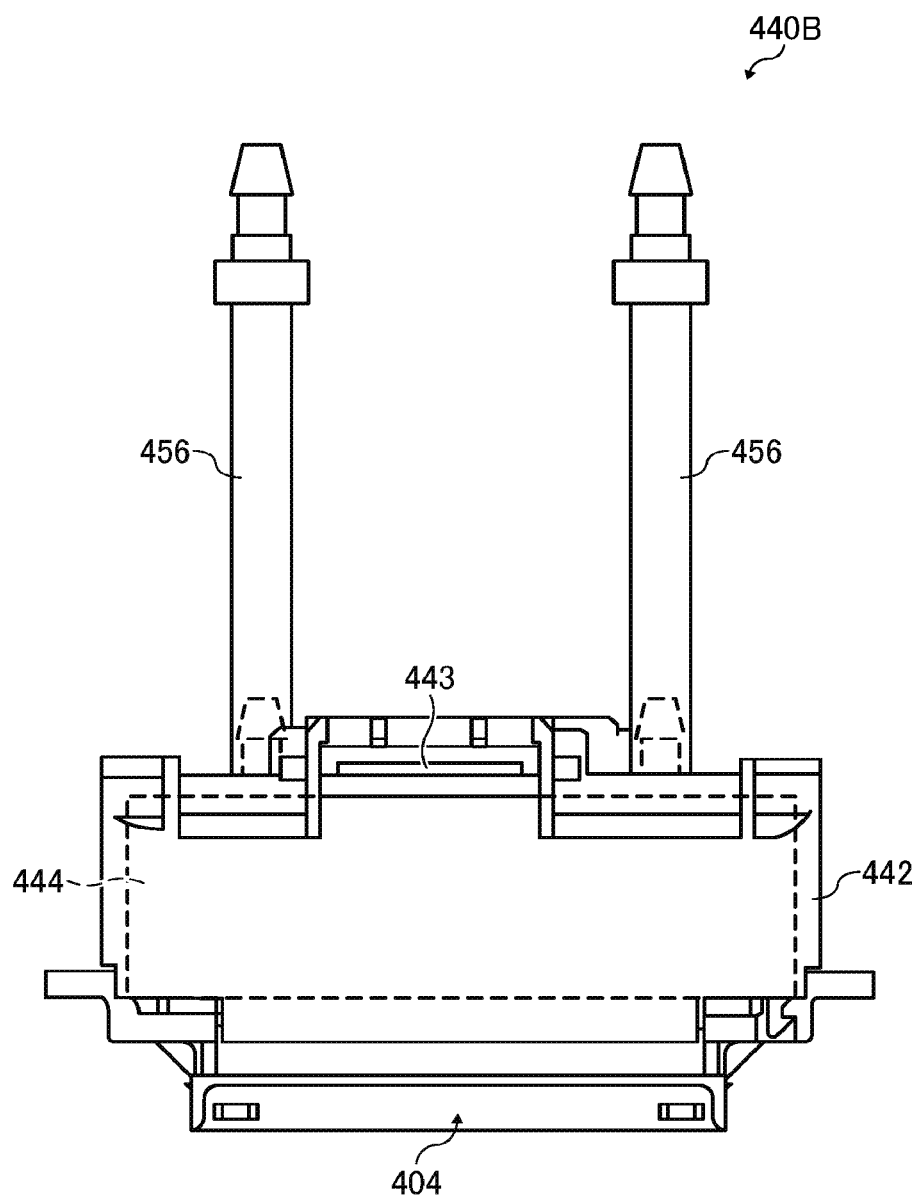
FIG. 36 is a front view of the liquid discharge device according to still another embodiment of the present disclosure.

Next, the liquid discharge device according to still another embodiment of the present disclosure is described with reference to FIG. 36. FIG. 36 is a front view of the liquid discharge device 440B still another embodiment of the present disclosure.

The liquid discharge device 440B includes the liquid discharge head 404 to which a channel part 444 is mounted and a tube 456 connected to the channel part 444.

The channel part 444 is disposed inside a cover 442. Instead of the channel part 444, the liquid discharge device 440B may include the head tank 441. A connector 443 for electrical connection with the liquid discharge head 404 is disposed on an upper part of the channel part 444.

In the present application, liquid discharged from the liquid discharge head is not particularly limited as long as the liquid has a viscosity or a surface tension that can be discharged from the liquid discharge head, but it is preferable that the viscosity becomes 30 mPa·s or less under heating or cooling. Examples of the liquid include a solution, a suspension, or an emulsion that contains, for example, a solvent, such as water or an organic solvent, a colorant, such as dye or pigment, a functional material, such as a polymerizable compound, a resin, or a surfactant, a biocompatible material, such as DNA, amino acid, protein, or calcium, or an edible material, such as a natural colorant. Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source for generating energy to discharge liquid include a piezoelectric actuator (a laminated piezoelectric element or a thin-film piezoelectric element), a thermal actuator that employs a thermoelectric conversion element, such as a heating resistor (element), and an electrostatic actuator including a diaphragm and opposed electrodes.

The "liquid discharge device" is an integrated unit including the liquid discharge head and a functional part(s) or unit(s) and is an assembly of parts relating to liquid discharge. For example, the "liquid discharge device" includes a combination of the liquid discharge head with at least one of a head tank, a carriage, a supply unit, a maintenance unit, and a main scan moving unit.

Examples of the integrated unit include a combination in which the liquid discharge head and one or more functional parts and devices are secured to each other through, e.g., fastening, bonding, or engaging, and a combination in which one of the liquid discharge head and the functional parts and devices is movably held by another. Further, the liquid discharge head, the functional parts, and the mechanism may be configured to be detachable from each other.

For example, the liquid discharge head and the head tank are integrated as the liquid discharge device. Alternatively, the liquid discharge head may be coupled with the head tank through a tube or the like to integrally form the liquid discharge device. A unit including a filter may be added at a position between the head tank and the liquid discharge head of the liquid discharge device.

As another example, the liquid discharge device is an integrated unit in which the liquid discharge head and the carriage are integrated as a single unit.

In still another example, the liquid discharge device includes the liquid discharge head movably held by a guide that forms part of a main scan moving unit, so that the liquid discharge head and the main scan moving unit are integrated as a single unit. The liquid discharge device may include the head, the carriage, and the main scan moving unit that are integrated as a single unit.

In still another example, the cap that forms part of the maintenance unit is secured to the carriage mounting the liquid discharge head so that the liquid discharge head, the carriage, and the maintenance unit are integrated as a single unit to form the liquid discharge device.

Further, in still another example, the liquid discharge device includes tubes connected to the head tank or the head mounting the channel member so that the liquid discharge head and the supply unit are integrated as a single unit. Through the tube, the liquid of the liquid storage source such as an ink cartridge is supplied to the head.

The main scan moving unit may be a guide only. The supply unit may be a tube(s) only or a loading unit only.

The term "liquid discharge apparatus" used herein also represents an apparatus including the head or the liquid discharge device to discharge liquid by driving the head. The liquid discharge apparatus may be, for example, an apparatus capable of discharging liquid to a material to which liquid can adhere or an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, onto which the liquid has been discharged.

The "liquid discharge apparatus" may be, for example, an image forming apparatus to form an image on a sheet by discharging ink, or a three-dimensional fabrication apparatus to discharge a fabrication liquid to a powder layer in which powder material is formed in layers to form a three-dimensional fabrication object.

The liquid discharge apparatus (apparatus for discharging liquid) is not limited to an apparatus to discharge liquid to visualize meaningful images, such as letters or figures. For example, the liquid discharge apparatus includes an apparatus to form meaningless images, such as meaningless patterns, or fabricate three-dimensional images.

The above-described term "material onto which liquid adheres" denotes, for example, a material or a medium onto which liquid is adhered at least temporarily, a material or a medium onto which liquid is adhered and fixed, or a material or a medium onto which liquid is adhered and into which the liquid permeates. Examples of the "material onto which liquid adheres" include recording media such as a paper sheet, recording paper, and a recording sheet of paper, film, and cloth, electronic components such as an electronic board and a piezoelectric element, and media such as a powder layer, an organ model, and a testing cell. The "material onto which liquid adheres" includes any material on which liquid adheres unless particularly limited.

The above-mentioned "material to which liquid adheres" may be any material as long as liquid can temporarily adhere such as paper, thread, fiber, cloth, leather, metal, plastic, glass, wood, ceramics, or the like.

The liquid discharge apparatus (apparatus for discharging liquid) may be an apparatus to relatively move a liquid discharge head and a material on which liquid can be adhered. However, the apparatus for discharging liquid is not limited to such an apparatus. The liquid discharge apparatus may be, for example, a serial-type apparatus to move a liquid discharge head relative to a sheet material or a line-type apparatus that does not move a liquid discharge head relative to a sheet material.

Examples of the "liquid discharge apparatus" further include a treatment liquid coating apparatus to discharge a treatment liquid to a sheet to coat the treatment liquid on a sheet surface to reform the sheet surface and an injection granulation apparatus in which a composition liquid including raw materials dispersed in a solution is discharged through nozzles to granulate fine particles of the raw materials.

The terms "image formation", "recording", "printing", "image printing", and "fabricating" used herein may be used synonymously with each other.

The flexible member according to an embodiment of the present disclosure can also be used for an electronic device, such as a display device or a personal computer.

Note that embodiments of the present invention are not limited to the above-described embodiments and it is apparent that the above-described embodiments can be appropriately modified within the scope of the technical idea of the present invention in addition to what is suggested in the above-described embodiments. Further, the number, position, shape, and so on of components are not limited to those of the present embodiment, and may be the number, position, shape, and so on that are suitable for implementing the present invention.

What is claimed is:

1. A flexible member comprising:
    a first member;
    a second member overlapping the first member; and
    a plurality of second reinforcing portions,
    the first member including a non-overlapping region not overlapping the second member,
    the non-overlapping region including an edge portion of the first member,
    the second member including a plurality of first reinforcing portions between which the non-overlapping region is interposed,
    each of the plurality of second reinforcing portions overlapping both a first area of the second member in which one of the plurality of first reinforcing portions is formed and a second area of the second member other than the first area when the flexible member is projected from a direction perpendicular to a surface of the flexible member.

2. The flexible member according to claim 1,
    wherein the plurality of second reinforcing portions is disposed on a first surface of the first member opposite to a second surface of the first member on which the plurality of first reinforcing portions is disposed.

3. The flexible member according to claim 1,
wherein the plurality of first reinforcing portions is disposed on both surfaces of the first member.

4. The flexible member according to claim 3,
wherein the plurality of first reinforcing portions is spaced apart from the second member.

5. The flexible member according to claim 1,
wherein the plurality of first reinforcing portions is disposed on both sides in a longitudinal direction of the non-overlapping region.

6. The flexible member according to claim 1, further comprising a plurality of conductor wires arranged side by side on the first member,
wherein the second member covers the plurality of conductor wires and exposes terminal portions of the plurality of conductor wires, and
wherein the plurality of first reinforcing portions is arranged side by side with the terminal portions of the plurality of conductor wires in a terminal-portion arrangement direction in which the terminal portions are arranged side by side.

7. The flexible member according to claim 6,
wherein the plurality of second reinforcing portions and the plurality of conductor wires are of an identical conductor pattern.

8. The flexible member according to claim 6,
wherein each of the plurality of second reinforcing portions has a width equal to a width of each of the terminal portions of the plurality of conductor wires.

9. The flexible member according to claim 6,
wherein the plurality of second reinforcing portions is arranged side by side in the terminal-portion arrangement direction, and
wherein an arrangement interval of the plurality of second reinforcing portions is equal to an arrangement interval of the terminal portions of the plurality of conductor wires.

10. The flexible member according to claim 9,
wherein the plurality of second reinforcing portions extends in an extending direction of the terminal portions of the plurality of conductor wires,
wherein each of the plurality of second reinforcing portions includes a first portion and a second portion,
wherein the first portion overlaps the second member and one of the plurality of first reinforcing portions across an extension line extending a boundary line between the non-overlapping region and the second member, and
wherein the second portion extends from an end of the first portion in a direction intersecting the extending direction of the terminal portions of the plurality of conductor wires and overlaps the second member.

11. The flexible member according to claim 9,
wherein an arrangement interval between one of the plurality of second reinforcing portions and one of the plurality of conductor wires adjacent to the one of the plurality of second reinforcing portions is equal to the arrangement interval of the terminal portions of the plurality of conductor wires.

12. A wiring member comprising,
the flexible member according to claim 6; and
a connecting member including a plurality of conductor wires connected to the plurality of conductor wires of the flexible member.

13. The wiring member according to claim 12,
wherein the plurality of second reinforcing portions is not connected to the plurality of conductor wires of the connecting member.

14. The wiring member according to claim 12,
wherein the plurality of second reinforcing portions is connected to a dummy wire of the connecting member.

15. A liquid discharge head comprising the flexible member according to claim 1.

16. A liquid discharge device comprising the liquid discharge head according to claim 15.

17. The liquid discharge device according to claim 16, wherein the liquid discharge head is integrated with at least one of:
a head tank that stores liquid to be supplied to the liquid discharge head;
a carriage mounted with the liquid discharge head;
a supply unit to supply liquid to the liquid discharge head;
a maintenance unit to maintain and recover the liquid discharge head; and
a main scan moving unit to move the liquid discharge head in a main scanning direction.

18. A liquid discharge apparatus comprising the flexible member according to claim 1.

19. An electronic device comprising the flexible member according to claim 1.

20. A flexible member comprising:
a first member; and
a second member overlapping the first member,
wherein, when the flexible member is projected from a direction perpendicular to a surface of the flexible member, the first member includes a non-overlapping region not overlapping the second member,
the non-overlapping region includes an edge portion of the first member,
the second member includes a plurality of first reinforcing portions between which the non-overlapping region is interposed, and
a plurality of second reinforcing portions, each of which overlaps the second member and one of the plurality of first reinforcing portions.

* * * * *